United States Patent [19]
Yamada

[11] Patent Number: 5,912,591
[45] Date of Patent: Jun. 15, 1999

[54] OSCILLATOR CIRCUIT AND DELAY CIRCUIT

[75] Inventor: Takashi Yamada, Tokyo, Japan

[73] Assignee: NEC Corporation, Tokyo, Japan

[21] Appl. No.: 09/024,298

[22] Filed: Feb. 17, 1998

[30] Foreign Application Priority Data

Feb. 14, 1997 [JP] Japan .................................... 9-047191

[51] Int. Cl.$^6$ ...................................................... H03B 5/24
[52] U.S. Cl. .................. 331/57; 331/108 C; 331/177 R; 331/179; 326/36; 327/281
[58] Field of Search ........................ 331/34, 57, 117 FE, 331/108 C, 177 R, 179; 326/36; 327/281

[56] References Cited

PUBLICATIONS

"MOSFET in Circuit Design"; Crawford, R.H..; 1967; McGraw–Hill Book Company; p. 93.

Primary Examiner—David Mis
Attorney, Agent, or Firm—Young & Thompson

[57] ABSTRACT

The present invention provides a novel circuitry comprising a series connection of a plurality of invertor gates, each of which has field effect transistors, wherein at least one of the field effect transistors has a back bias control terminal; and a various bias voltage generator being capable of generating at least one bias voltage and also capable of varying the at least one bias voltage individually, the various bias voltage generator being also electrically connected to the back bias control terminal of the at least one of the field effect transistors for applying the at least one bias voltage to the back bias control terminal so that the various bias voltage generator is operated to individually vary the at least one bias voltage thereby to individually vary a threshold voltage of the at least one of the field effect transistors.

44 Claims, 18 Drawing Sheets

OSCILLATOR CIRCUIT AND DELAY CIRCUIT

BACKGROUND OF THE INVENTION

The present invention relates to an oscillator circuit and a delay circuit, and more particularly to an oscillator circuit which may be integrated in a semiconductor integrated circuit and which is capable of changing oscillation frequency, duty ratio and phase as well as a delay circuit which is capable of changing delay time, rise time and fall time.

In the Japanese laid-open patent publication No. 59-86326, a conventional oscillator circuit is disclosed which is capable of changing oscillation frequency and duty ratio.

FIG. 1 is a circuit diagram illustrative of a conventional oscillator circuit which is capable of changing oscillation frequency and duty ratio. The conventional oscillator circuit has a plurality of invertors INV1, INV2, . . . INV2k+1 (k: natural number) which are connected in series to each other on an odd stage to form a ring oscillator. The conventional oscillator circuit has a plurality of p-channel MOS field effect transistors connected between the invertor and the high voltage line as well as a plurality of n-channel MOS field effect transistors connected between the invertor and the ground line. The conventional oscillator circuit also has a gate voltage control unit 2 which operates to output gate signals to individual p-channel and n-channel MOS field effect transistors.

The invertor INV1 has a power terminal which is connected in series to a p-channel MOS field effect transistor TP1 which is connected to a high voltage line. A drain of the p-channel MOS field effect transistor TP1 is connected to the high voltage line, whilst a source of the p-channel MOS field effect transistor TP1 is connected to the power terminal of the inverter INV1. The invertor INV1 also has a ground terminal which is connected in series to an n-channel MOS field effect transistor TN1 which is connected to a ground line. A drain of the n-channel MOS field effect transistor TN1 is connected to the group terminal of the n-channel MOS field effect transistor TN1, whilst a source of the n-channel MOS field effect transistor TN1 is connected to the ground line. A gate of the p-channel MOS field effect transistor TP1 is connected to the gate voltage control unit 2 for receiving a gate signal GP1. A gate of the n-channel MOS field effect transistor TN1 is also connected to the gate voltage control unit 2 for receiving a gate signal GN1.

Also, the invertor INV2 has a power terminal which is connected in series to a p-channel MOS field effect transistor TP2 which is connected to a high voltage line. A drain of the p-channel MOS field effect transistor TP2 is connected to the high voltage line, whilst a source of the p-channel MOS field effect transistor TP2 is connected to the power terminal of the inverter INV2. The invertor INV2 also has a ground terminal which is connected in series to an n-channel MOS field effect transistor TN2 which is connected to a ground line. A drain of the n-channel MOS field effect transistor TN2 is connected to the ground terminal of the n-channel MOS field effect transistor TN2, whilst a source of the n-channel MSO field effect transistor TN2 is connected to the ground line. A gate of the p-channel MOS field effect transistor TP2 is connected to the gate voltage control unit 2 for receiving a gate signal GP2. A gate of the n-channel MOS field effect transistor TN2 is also connected to the gate voltage control unit 2 for receiving a gate signal GN2.

Also, the invertor INV2K+2 has a power terminal which is connected in series to a p-channel MOS field effect transistor TP2K+2 which is connected to a high voltage line. A drain of the p-channel MOS field effect transistor TP2K+2 is connected to the high voltage line, whilst a source of the p-channel MOS field effect transistor TP2K+2 is connected to the power terminal of the inverter INV2K+2. The invertor INV2K+2 also has a ground terminal which is connected in series to an n-channel MOS field effect transistor TN2K+2 which is connected to a ground line. A drain of the n-channel MOS field effect transistor TN2K+2 is connected to the ground terminal of the n-channel MOS field effect transistor TN2K+2, whilst a source of the n-channel MOS field effect transistor TN2K+2 is connected to the ground line. A gate of the p-channel MOS field effect transistor TP2K+2 is connected to the gate voltage control unit 2 for receiving a gate signal GP2K+2. A gate of the n-channel MOS field effect transistor TN2K+2 is also connected to the gate voltage control unit 2 for receiving a gate signal GN2K+2. The gate signals outputted from the gate voltage control unit 2 are in correspondence to the oscillation frequency and the duty ratio.

Operations of the above circuit will be described as follows. If the p-channel MOS field effect transistor TP1 is operated in a non-saturation region, then an ON-resistance of the p-channel MOS field effect transistor TP1 is given by the following equation.

$$\text{Ron} = \{\beta(\text{VGS}-\text{Vth}-\text{VDS}/2)\}^{-1} \qquad (1)$$

where $\beta$ is the capacity coefficient, VGS is the gate source voltage, VDS is the source drain voltage and Vth is the threshold voltage. This means that the ON-resistance Ron is added between the power terminal of the invertor INV1 and the high voltage line. It may equivalently be considered that the current driving ability of the invertor INV1 is controlled by a gate output voltage GP1 from the gate voltage control unit 2. The above descriptions about the ON-resistance of the p-channel MOS field effect transistor TP1 may be applicable to other p-channel and n-channel MOS field effect transistors. The current driving ability of the logic gates on individual stages which forms a ring-oscillator are controllable by the gate voltage outputted from the gate voltage control unit 2 whereby the oscillation frequency and the duty ratio can be changed.

More concretely, in order to rise the oscillation frequency, it is required that the current driving ability of the logic gate on each stage is increased. Therefore, the gate voltage GP1, GP2 . . . GP2k+1 to be applied to the gates of the p-channel MOS field effect transistors are dropped whilst the gate voltage GN1, GN2 . . . GN2k+1 to be applied to the gates of the n-channel MOS field effect transistors are risen.

In order to increase the duty ratio, it is required that the falling speed of the output from the logic gates on the odd stages and the rising speed of the output from the logic gates on the even stages are decreased as well as that the rising speed of the output from the logic gates on the odd stages and the falling speed of the output from the logic gates on the even stages are increased. Therefore, the gate voltages GP1, GN1, GP3, GN3 GP2K+1, and GN2k+1 to be applied to the gates of the p-channel and n-channel MOS field effect transistors in the logic gates on the odd stages are dropped whilst the gate voltages GP2, GN2, GP4, GN4, GP2k, and GN2k to be applied to the gates of the p-channel and n-channel MOS field effect transistors in the logic gates on the even stages are risen.

The above oscillator circuit has the following disadvantages. As compared to when the ring-oscillator simply comprises invertors, the current driving ability of the above oscillator circuit is lower by the ON-resistance of the MOS field effect transistors in the logic gates. Variable ranges of the oscillation frequency and the duty ratio of the above oscillator circuit are limited by the maximum current driving ability of each of logic gates which form the ring oscillator, for which reason it is required that the gate width of the MOS field effect transistors and the invertors in the logic gates are widen. This means that of the operational frequency is large, the gate width is large or widen whereby the occupied area of the oscillator circuit is large.

Subsequently, a conventional delay circuit will be described as follows. FIG. 2 is a circuit diagram illustrative of a conventional delay circuit. The conventional delay circuit has a series connection of invertors on j-stages (j: is even not less than 2) between input and output terminals.

The first stage invertor comprises a first series connection of three p-channel MOS field effect transistors TPa1, TPb1, and TPc1 and a second series connection of three n-channel MOS field effect transistors TNa1, TNb1 and TNc1. The gates of the p-channel and n-channel MOS field effect transistors TPa1, TPb1, TPc1, TNa1, TNb1 and TNc1 are connected to the input terminal. The first series connection of the three p-channel MOS field effect transistors TPa1, TPb1 and TPc1 are connected between the high voltage line and an output terminal of the first stage invertor. The second series connection of the three n-channel MOS field effect transistors TNa1, TNb1 and TNc1 are connected between the ground line and an output terminal of the first stage invertor.

The second stage invertor comprises a third series connection of three p-channel MOS field effect transistors TPa2, TPb2 and TPc2 and a fourth series connection of three n-channel MOS field effect transistors TNa2, TNb2 and TNc2. The gates of the p-channel and n-channel MOS field effect transistors TPa2, TPb2, TPc2, TNa2, TNb2 and TNc2 are connected to the input terminal of the second stage invertor. The third series connection of the three p-channel MOS field effect transistors TPa2, TPb2 and TPc2 are connected between the high voltage line and an output terminal of the second stage invertor. The fourth series connection of the three n-channel MOS field effect transistors TNa2, TNb2 and TNc2 are connected between the ground line and an output terminal of the second stage invertor.

The other stage invertor has the same circuit configuration as described above.

The current driving ability of each of the invertors is inversely proportional to the sum of the ON-resistances of the transistors connected in series. As compared to when each the inventors comprises a pair of p-channel and n-channel MOS field effect transistors, the current driving ability of the above delay circuit is low.

In addition, the capacitance to be driven by the each invertor on one stage is the gate capacitance of the invertor on the next stage to the one stage, for which reason the capacitance of the next stage is large due to the fact that the each invertor comprises series connections of the six MOS field effect transistors.

Further, since the transistors are connected in series, then the threshold voltages of the p-channel and n-channel MOS field effect transistors TNan and TPan ($1 \leq n \leq j$) connected to the output terminal of the each invertor are higher than the threshold voltages of the p-channel and n-channel MOS field effect transistors TNcn and TPcn ($1 \leq n \leq j$) connected to the ground line and the high voltage line.

The above three matters cause a relatively large delay of the delay circuit.

Another conventional delay circuit will subsequently be described prior to the descriptions of disadvantages of the above descried delay circuit. FIG. 3 is a circuit diagram illustrative of the other conventional delay circuit.

The other conventional delay circuit has a series connection of invertors on j-stages (j: is even not less than 2) between input and output terminals.

The first stage invertor comprises a first series connection of a single p-channel MOS field effect transistor TPa1 and a second series connection of three n-channel MOS field effect transistors TNa1, TNb1 and TNc1. The gates of the p-channel and n-channel MOS field effect transistors TPa1, TNa1, TNb1 and TNc1 are connected to the input terminal. The first series connection of the single p-channel MOS field effect transistor TPa1 is connected between the high voltage line and an output terminal of the first stage invertor. The second series connection of the three n-channel MOS field effect transistors TNa1, TNb1 and TNc1 are connected between the ground line and an output terminal of the first stage invertor.

The second stage invertor comprises a third series connection of three p-channel MOS field effect transistor TPa2, TPb2 and TPc2 and a fourth series connection of three n-channel MOS field effect transistors TNa2. The gates of the p-channel and n-channel MOS field effect transistors TPa2, TPb2, TPc2 and TNa2 are connected to the input terminal of the second stage invertor. The third series connection of the three p-channel MOS field effect transistor TPa2, TPb2 and TPc2 are connected between the high voltage line and an output terminal of the second stage invertor. The fourth series connection of the single n-channel MOS field effect transistor TNa1 is connected between the ground line and an output terminal of the second stage invertor.

The odd stage invertor comprises a series connection of a single p-channel MOS field effect transistor between the high voltage line and the output terminal of this odd stage invertor as well as a series connection of three n-channel MOS field transistors between the ground line and the output terminal of this odd stage invertor.

In contrast, the even stage invertor comprises a series connection of three p-channel MOS field effect transistors between the high voltage line and the output terminal of this odd stage invertor as well as a series connection of a single n-channel MOS field effect transistor between the ground line and the output terminal of this even stage invertor.

Only the last stage inverter on the last stage, however, has a simple circuit configuration for avoiding a disturbance of the waveform of the output signals from the delay circuit. Namely, the last stage inverter comprises a pair of p-channel and n-channel MOS field effect transistors connected in series between the high voltage line and the ground line, wherein the p-channel MOS field effect transistor is connected between the high voltage line and the output terminal of the delay circuit whilst the n-channel MOS field effect transistor is connected between the ground line and the output terminal of the delay circuit.

In the above second conventional delay circuit, the invertors on the odd stages shown the fast rising speed and slow falling speed, whilst the invertors on the even stages show the slow rising speed and fast falling speed. Therefore, if the rising signal is inputted to the input terminal of the above delay circuit, then the rising signal will appear at the output terminal with a large delay. If, however, the fall signal is inputted to the input terminal, then the fall signal will appear at the output terminal without substantive delay.

The above two delay circuits also have the following disadvantages. Since the each invertor comprises series connections of many transistors, a large area of the delay circuit is required.

Further, once the delay time has been set in circuit design work, the delay times are likely to be varied due to variations on the manufacturing, variations in power voltage on operation and temperature variations. There has been no compensation way for compensating the variation in delay time of the delay circuit.

In the above circumstances, it had been required to develop a novel oscillator circuit and a delay circuit, both of which are free from the above disadvantages.

SUMMARY OF THE INVENTION

Accordingly, it is an object of the present invention to provide a novel oscillator circuit free from the above problems.

It is a further object of the present invention to provide a novel oscillator circuit which is capable of varying an oscillation frequency.

It is a still further object of the present invention to provide a novel oscillator circuit which is capable of varying a duty ratio.

It is yet a further object of the present invention to provide a novel oscillator circuit which is capable of controlling an operational phase.

It is a further more object of the present invention to provide a novel oscillator circuit which is reduced in occupied area.

It is still more object of the present invention to provide a novel delay circuit free from the above problems.

It is moreover object of the present invention to provide a novel delay circuit which is reduced in occupied area.

It is another object of the present invention to provide a novel delay circuit which is capable of controlling a delay time.

It is still another object of the present invention to provide a novel delay circuit which is capable of controlling rise time.

It is yet another object of the present invention to provide a novel delay circuit which is capable of controlling fall time.

The above and other objects, features and advantages of the present invention will be apparent from the following descriptions.

The present invention provides a novel circuitry comprising a series connection of a plurality of invertor gates, each of which has field effect transistors, wherein at least one of the field effect transistors has a back bias control terminal; and a various bias voltage generator being capable of generating at least one bias voltage and also capable of varying the at least one bias voltage individually, the various bias voltage generator being also electrically connected to the back bias control terminal of the at least one of the field effect transistors for applying the at least one bias voltage to the back bias control terminal so that the various bias voltage generator is operated to individually vary the at least one bias voltage thereby to individually vary a threshold voltage of the at least one of the field effect transistors.

BRIEF DESCRIPTION OF THE DRAWINGS

Preferred embodiments according to the present invention will be described in detail with reference to the accompanying drawings.

DISCLOSURE OF THE INVENTION

Figure 1:
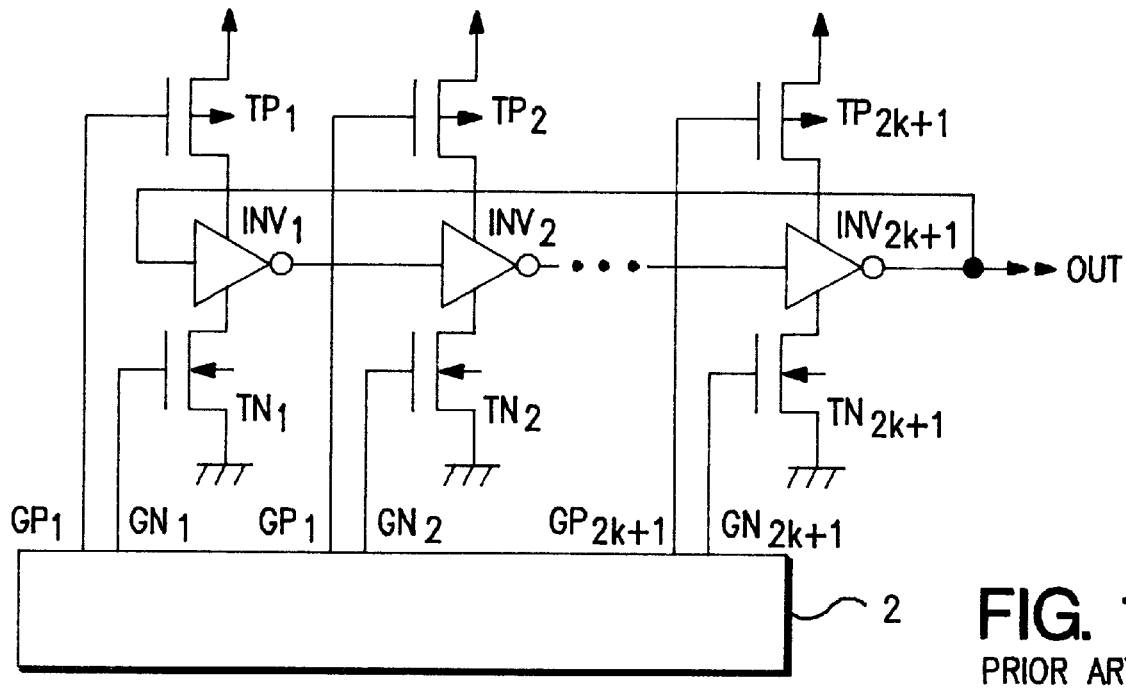
FIG. 1 is a circuit diagram illustrative of a conventional oscillator circuit which is capable of changing oscillation frequency and duty ratio.
Figure 2:
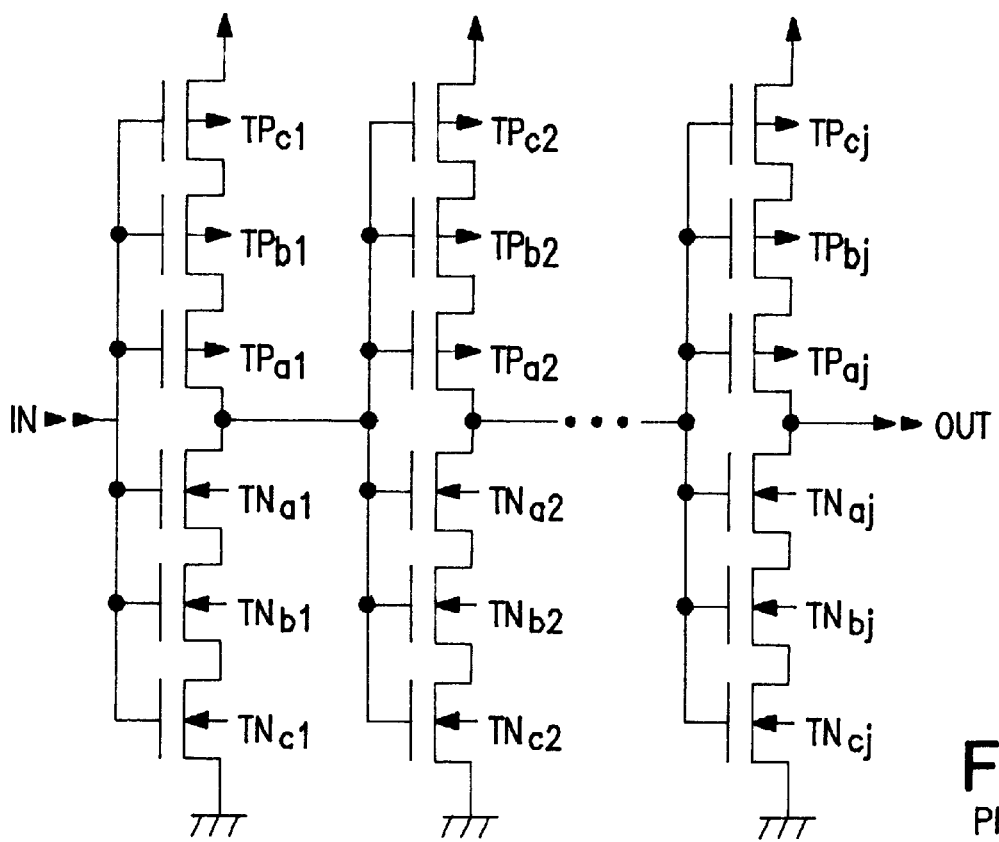
FIG. 2 is a circuit diagram illustrative of a conventional delay circuit.
Figure 3:
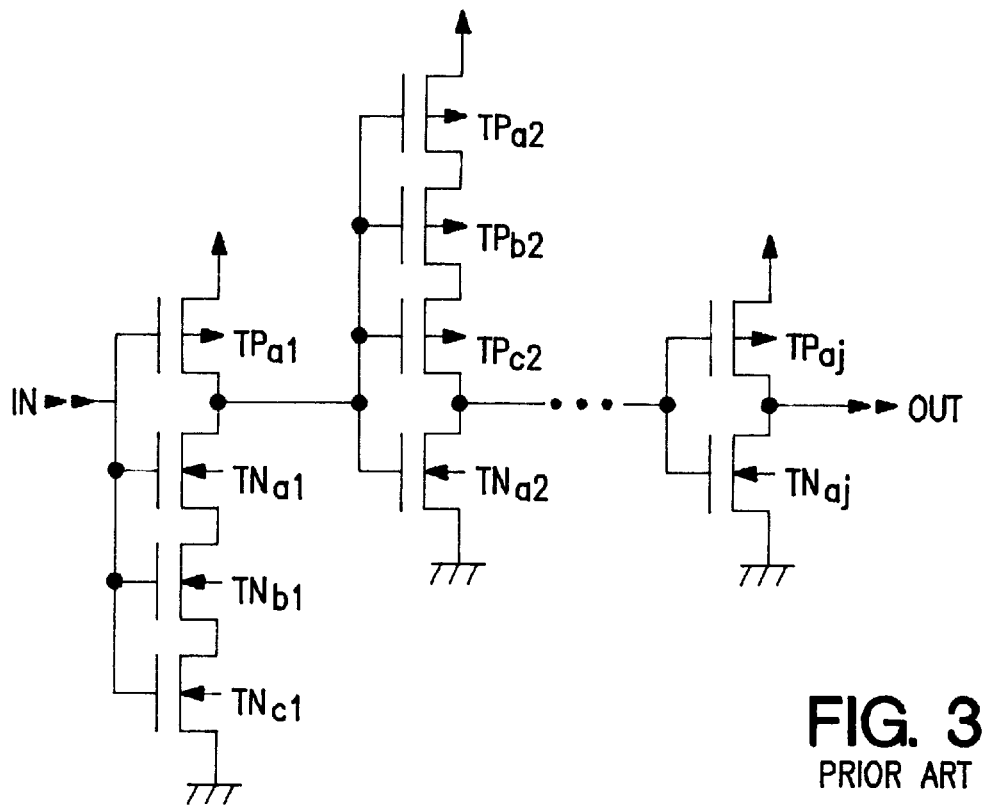
FIG. 3 is a circuit diagram illustrative of the other conventional delay circuit.

The present invention provides a novel circuitry comprising a series connection of a plurality of invertor gates, each of which has field effect transistors, wherein at least one of the field effect transistors has a back bias control terminal; and a various bias voltage generator being capable of generating at least one bias voltage and also capable of varying the at least one bias voltage individually, the various bias voltage generator being also electrically connected to the back bias control terminal of the at least one of the field effect transistors for applying the at least one bias voltage to the back bias control terminal so that the various bias voltage generator is operated to individually vary the at least one bias voltage thereby to individually vary a threshold voltage of the at least one of the field effect transistors.

It is preferable that a plurality of the field effect transistors have the back bias control terminals and the various bias voltage generator is capable of vary a plurality of the bias voltage individually so as to individually vary threshold voltages of the plurality of the field effect transistors having the back bias control terminals. In this case, it is more preferable that all of the field effect transistors have the back bias control terminals and the various bias voltage generator is capable of vary a plurality of the bias voltage independently so as to separately vary threshold voltages of the all field effect transistors.

It is also preferable that the field effect transistors are formed in at least a plurality of first conductivity type semiconductor well regions electrically isolated from each other and also formed in at least a second conductivity type semiconductor well region electrically isolated from the first conductivity type semiconductor well regions, and wherein at least one of the first conductivity type semiconductor well regions has the back bias control terminal electrically connected to the various bias voltage generator so that the various bias voltage generator is operated to separately vary a potential of the at least one of the first conductivity type semiconductor well regions thereby to separately vary a threshold voltage of the at least one of the field effect transistors. In this case, it is more preferable that the field effect transistors are formed in a plurality of first conductivity type semiconductor well regions electrically isolated from each other and also formed in a plurality of second conductivity type semiconductor well regions electrically isolated from each other and from the first conductivity type semiconductor well regions, and wherein all of the first and second conductivity type semiconductor well regions have the back bias control terminals electrically connected to the various bias voltage generator so that the various bias voltage generator is operated to individually vary potentials of all of the first and second conductivity type semiconductor well regions thereby to individually vary threshold voltages of all of the field effect transistors.

It is also preferable that the field effect transistors have a silicon-on-insulator structure and at least one of the field effect transistors has a channel region electrically connected to the back bias control terminal electrically connected to the various bias voltage generator so that the various bias voltage generator is operated to individually vary a potential of the channel region of the at least one of the field effect transistors thereby to individually vary a threshold voltage of the at least one of the field effect transistors. In this case, it is more preferable that all of the field effect transistors have channel regions electrically connected to the back bias control terminals electrically connected to the various bias voltage generator so that the various bias voltage generator is operated to separately vary potentials of the channel regions of all of the field effect transistors thereby to separately vary threshold voltages of all of the field effect transistors.

It is also preferable that the field effect transistors have a silicon-on-insulator structure and at least one of the field effect transistors has a back gate electrode in a surface region of a semiconductor substrate and the back gate electrode is electrically connected to the back bias control terminal electrically connected to the various bias voltage generator so that the various bias voltage generator is operated to individually vary a potential of the back gate electrode of the at least one of the field effect transistors thereby to individually vary a threshold voltage of the at least one of the field effect transistors. In this case, it is more preferable that all of the field effect transistors have back gate electrodes electrically connected to the back bias control terminals electrically connected to the various bias voltage generator so that the various bias voltage generator is operated to separately vary potentials of the back gate electrodes of all of the field effect transistors thereby to separately vary threshold voltages of all of the field effect transistors.

It is also preferable that the invertor gates of add stages are connected in series to each other to form a ring-oscillator circuit.

It is also preferable that the invertor gates of even stages are connected in series to each other to form a delay circuit.

It is also preferable that each of the invertor gates comprises a complementary MOS circuit which comprises a series connection of p-channel and n-channel MOS field effect transistors between a high voltage line and a ground line.

In accordance with the present invention, a novel oscillator circuit comprises a ring-oscillator having field effect transistors which are applied with back-biases which have been controlled by a back bias control unit for controlling an oscillation frequency, a duty ratio and a phase. In more detail, the ring-oscillator may comprise a bulk complementary MOS circuit, wherein individual transistors of first and second conductivity type channels are formed in individual wells electrically isolated from each other so that the back bias control unit applied control voltages to the individual wells separately.

Alternatively, the ring-oscillator may be formed in a partial depletion silicon-on-insulator substrate, wherein the back bias control unit applies control voltages to individual channel regions of the transistors separately.

Further, alternatively, the ring-oscillator may be formed in a complete depletion silicon-on-insulator substrate, wherein the back bias control unit applies control voltages to individual back gates of the transistors separately.

The back bias control unit may apply control voltages to the individual wells to control potentials of individual wells of first and second conductivity types so as to cause a low potential of the n-well in which the p-channel MOS field effect transistor is formed as well as cause a high potential of the p-well in which the n-channel MOS field effect transistor is formed. As a result, threshold voltages of the individual transistors are dropped whereby the current driving ability of the ring-oscillator on the individual stage is increased and also the oscillation frequency is risen.

In order to drop the oscillation frequency, the potentials of the individual wells are so controlled that the n-well potential is high and the p-well potential is low.

Further, the back bias control unit may also apply control voltages to the individual wells to control potentials of individuals wells of first and second conductivity types so as to cause a low potential of the wells of the logic gates on odd stages as well as cause a high potential of the wells of the logic gates on the even stages. As a result, the rising speed of the output signals is fast whilst the falling speed of the output signal is slow whereby the duty ratio is increased.

In order to drop the duty ratio, the potential of the wells of the logic gates on the odd stages is risen whilst the potential of the wells of the logic gates on the even stages is dropped.

The back bias control unit is capable of varying the oscillation frequency as described above. Variations in oscillation frequency of the oscillator circuit cause a phase shift of the output signal. If, for example, the oscillation frequency is temporary risen within a time shorter than a period and then returned to the original frequency, the phase of the output signal is advanced.

In order to delay the phase of the output signal, the oscillation frequency is temporary dropped and then returned to the original frequency.

The above oscillation circuit in accordance with the present invention provides the following two remarkable effects. The first effect is concerned with a reduction in occupied area of the oscillator circuit because any MOS field effect transistors with any large gate width are never required. The second effect is to allow the oscillator circuit to possess an extremely high oscillation frequency because the ring-oscillator may comprise simply structured invertor circuits and the threshold voltages of the transistors are controllable to be low.

In accordance with the further present invention, a novel delay circuit comprises series connections of invertors comprising transistors, wherein transistors on individual odd stages are applied with back-biases which have been controlled by a back bias control unit for controlling a delay time, a rise time and a fall time. In more detail, the invertor may comprise a bulk complementary MOS circuit, wherein individual transistors of first and second conductivity type channels are formed in individual wells electrically isolated from each other so that the back bias control unit applies control voltages to the individual wells separately.

Alternatively, the invertor may be formed in a partial depletion silicon-on-insulator substrate, wherein the back bias control unit applies control voltages to individual channel regions of the transistors separately.

Further, alternatively, the invertor may be formed in a complete depletion silicon-on-insulator substrate, wherein the back bias control unit applies control voltages to individual back gates of the transistors separately.

The back bias control unit may apply control voltages to the individual wells to control potentials of individual wells of first and second conductivity types so as to cause a low potential of the p-well in which the n-channel MOS field effect transistor is formed as well as cause a high potential of the n-well in which the p-channel MOS field effect transistor is formed. As a result, threshold voltages of the individual transistors are risen whereby the current driving ability of the ring-oscillator on the individual stage is decreased and also the delay time is large.

In order to short the delay time, the potentials of the individual wells are so controlled that the p-well potential is high and the n-well potential is low.

Further, the back bias control unit may also apply control voltages to the individual wells to control potentials of individual wells of first and second conductivity types so as to cause a low potential of the wells of the logic gates on odd stages as well as cause a high potential of the wells of the logic gates on the even stages. As a result, the rising speed of the output signals is fast whilst the falling speed of the output signal is slow whereby the duty ratio is increased.

In order to drop the duty ratio, the potential of the wells of the logic gates on the odd stages is risen whilst the potential of the wells of the logic gates on the even stages is dropped.

The back bias control unit is capable of varying potentials of the wells of the logic gates to that the potential of the wells of the logic gates on the odd stages is low whilst the potential of the wells of the logic gates on the even stages is high. As a result, if the rise signal is inputted, then the delay time is large. If the fall signal is inputted, then the delay time is low.

By contrast, the back bias control unit is capable of varying potentials of the wells of the logic gates so that the potential of the wells of the logic gates on the odd stages is high whilst the potential of the wells of the logic gates on the even stages is low. As a result, if the fall signal is inputted, then the delay time is large. If the rise signal is inputted, then the delay time is low.

The above delay circuit in accordance with the present invention provides the following two remarkable effects. The first effect is concerned with a reduction in occupied area of the delay circuit because the delay circuit may comprise the invertors, each of which has a pair of the p-channel and n-channel MOS field effect transistors. The second effect is to allow the delay circuit to vary the delay time, the rise time and the fall time by the control voltages. Namely, the delay time may be varied on operation because the delay time is controllable by the control voltage from the back bias voltage control unit.

Figure 4:
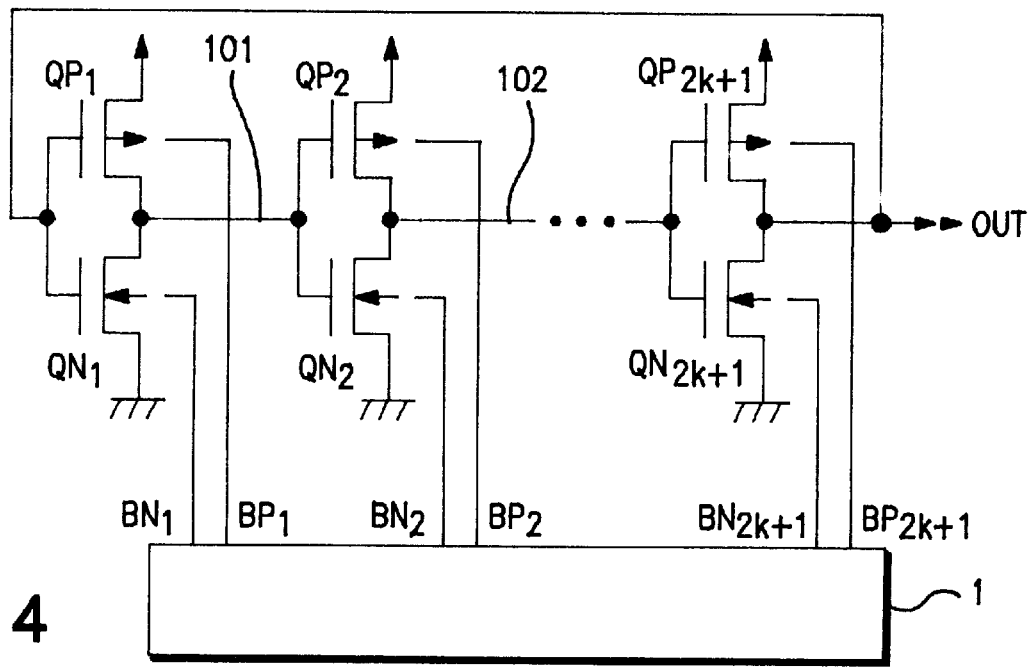
FIG. 4 is a circuit diagram illustrative of a novel oscillator circuit in the first embodiment in accordance with the present invention.

PREFERRED EMBODIMENTS
FIRST EMBODIMENT:

A first embodiment according to the present invention will be described wherein a novel oscillator circuit having bulk CMOS circuits is provided. FIG. 4 is a circuit diagram illustrative of a novel oscillator circuit in the first embodiment in accordance with the present invention. The novel oscillator circuit comprise a ring-oscillator circuit which comprises series connection of a plurality of invertors. Each of the invertors comprises a complementary MOS circuit which has a pair of p-channel and n-channel MOS field effect transistor connected in series between a high voltage line and a ground line.

The first stage invertor comprises a series connection of a p-channel MOS field effect transistor QP1 and an n-channel MOS field effect transistor QN1, wherein the p-channel MOS field effect transistor QP1 is connected in series between the high voltage line and an output terminal of the first stage invertor whilst the n-channel MOS field effect transistor QN1 is connected in series between the ground line and the output terminal of the first stage invertor. Gates of the p-channel and n-channel MOS field effect transistors QP1 and QN1 are connected to the input terminal of the first stage invertor.

The second stage invertor comprises a series connection of a p-channel MOS field effect transistor QP2 and an n-channel MOS field effect transistor QN2, wherein the p-channel MOS field effect transistor QP2 is connected in series between the high voltage line and an output terminal of the second stage invertor whilst the n-channel MOS field effect transistor QN2 is connected in series between the ground line and the output terminal of the second stage invertor. Gates of the p-channel and n-channel MOS field effect transistors QP2 and QN2 are connected to the input terminal of the second stage invertor.

The other invertors on the following stages have the same circuit configurations. The final stage invertor on the final stage comprises a series connection of a p-channel MOS field effect transistor QP2k+1 and an n-channel MOS field effect transistor QN2k+1, wherein the p-channel MOS field effect transistor QP2k+1 is connected in series between the high voltage line and an output terminal of the final stage invertor whilst the n-channel MOS field effect transistor QN2k+1 is connected in series between the ground line and the output terminal of the second stage invertor. Gates of the p-channel and n-channel MOS field effect transistors QP2k+1 and QN2k+1 are connected to the input terminal of the final stage invertor. An output terminal of the final stage invertor is connected to the input terminal of the first stage invertor so that the output signal from the final stage invertor is fed back to the first stage invertor.

The above novel oscillator circuit has a back bias control unit 1 which is electrically connected to back bias control terminals BP1, BN1, BP2, BN2, . . . BP2k+1 and BN2k+1. The back bias control terminals are further electrically connected to individual wells in which the individual p-channel and n-channel MOS field effect transistors are formed. The individual wells are electrically isolated from each other so that the back bias control unit 1 applied back bias control voltages to the individual wells separately. The back bias control unit 1 may have charge pump circuits which generate back bias control voltages.

The individual wells in which the p-channel and n-channel MOS field effect transistors QP1, QN1, QP2, QN2, . . . QP2k+1 and QN2k+1 are formed are electrically isolated from each other and also electrically connected to the individual back bias control terminals BP1, BN1, BP2, BN2, BP2k+1 and BN2k+1.

Figure 5:
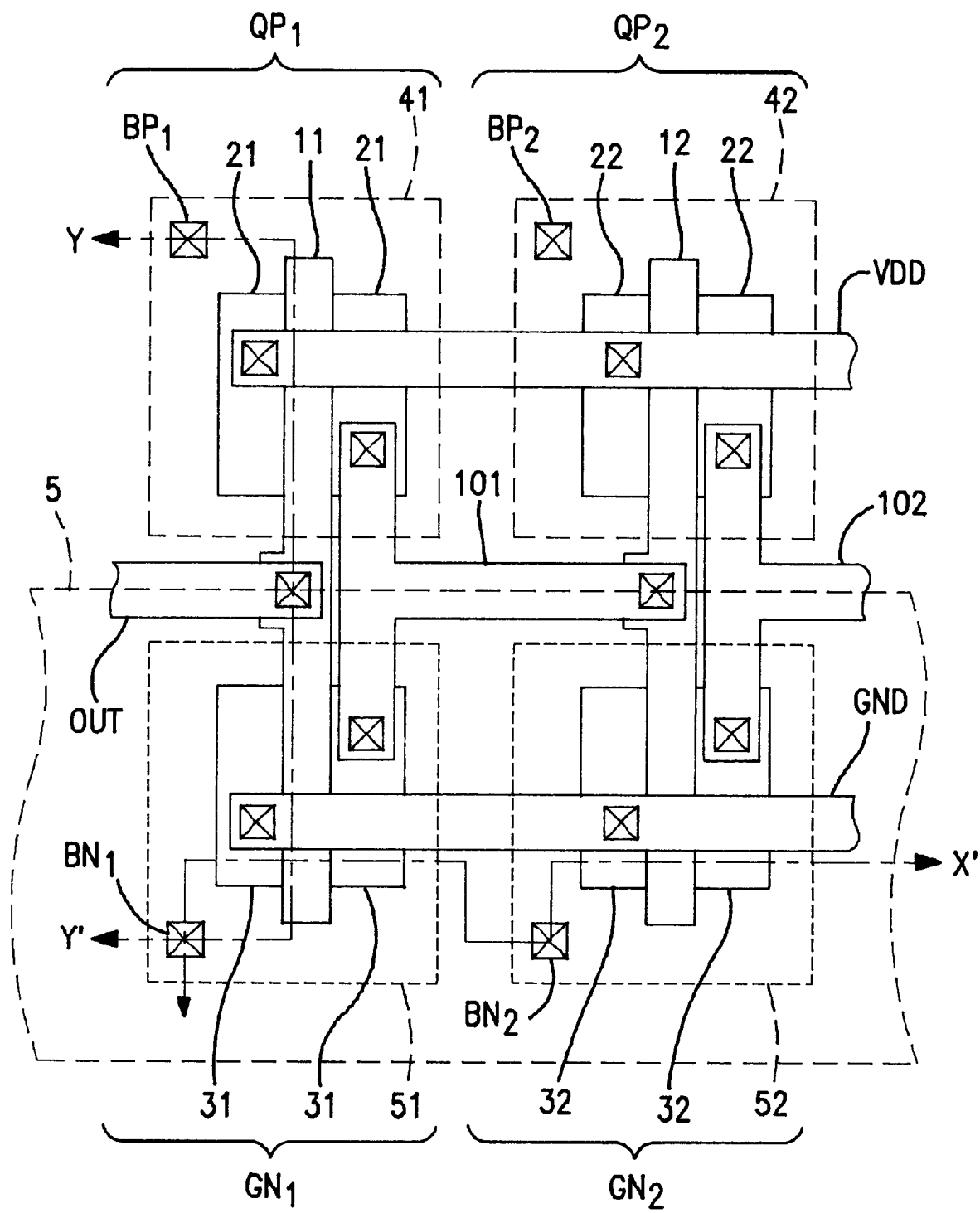
FIG. 5 is a plane view illustrative of the first and second stage invertors on the first and second stages in the oscillator circuit in the first embodiment in accordance with the present invention.
Figure 6A:
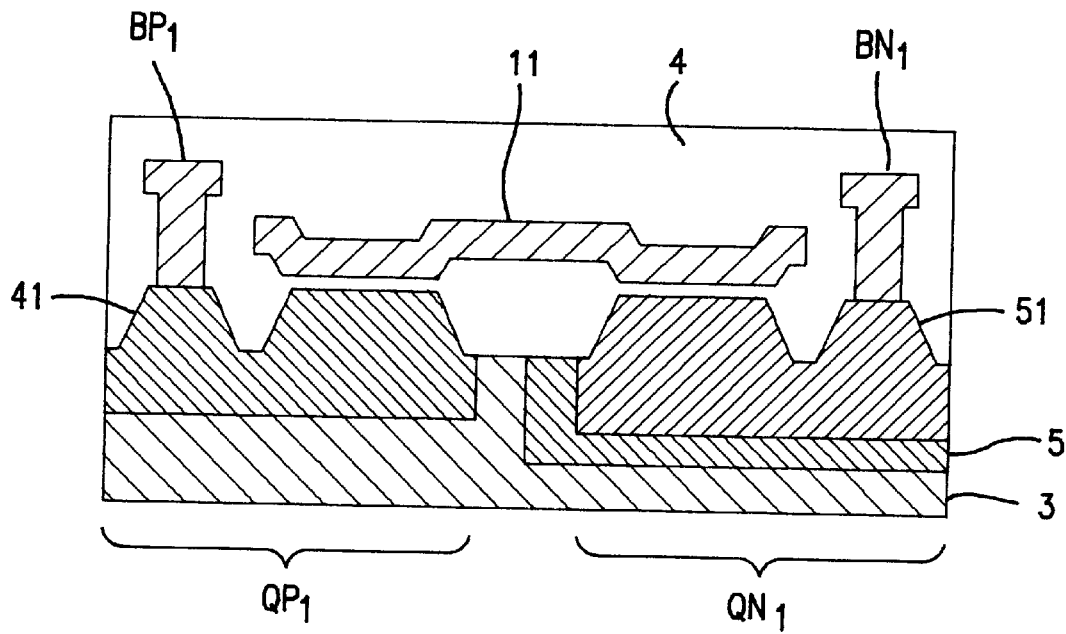
FIG. 6A is a fragmentary cross sectional elevation view taken along Y-Y' line of FIG. 5 illustrative of the first and second stage invertors on the first and second stages in the oscillator circuit in the first embodiment in accordance with the present invention.
Figure 6B:
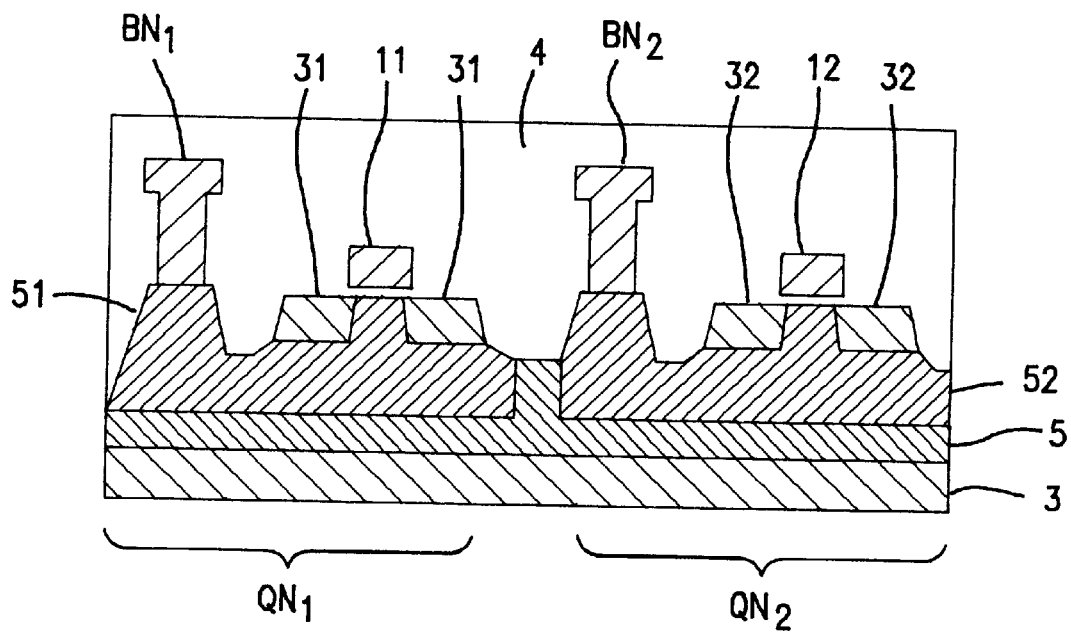
FIG. 6B is a fragmentary cross sectional elevation view taken along X-X' line of FIG. 5 illustrative of the first and second stage invertors on the first and second stages in the oscillator circuit in the first embodiment in accordance with the present invention.

FIG. 5 is a plane view illustrative of the first and second stage invertors on the first and second stages in the oscillator circuit in the first embodiment in accordance with the present invention. FIG. 6A is a fragmentary cross sectional elevation view taken along Y-Y' line of FIG. 5 illustrative of the first and second stage invertors on the first and second stages in the oscillator circuit in the first embodiment in accordance with the present invention. FIG. 6B is a fragmentary cross sectional elevation view taken along X-X' line of FIG. 5 illustrative of the first and second stage invertors on the first and second stages in the oscillator circuit in the first embodiment in accordance with the present invention.

The first and second stage invertors are formed on a p-type semiconductor substrate 3. An a-well 41, an n-well 42 and a deep n-well 5 are selectively formed in an upper region of the p-type semiconductor substrate 3 the n-wells 42 and the deep n-well 5 are isolated from each other by the p-type semiconductor substrate 3. Further, p-wells 51 and 52 are formed on the deep n-well 5 so that the p-wells 51 and 52 are isolated from each other by the deep n-well 5. A pair of p-type diffusion layers 21 is formed on the n-well 41. A pair of p-type diffusion regions 22 is formed on the n-well 42. A pair of n-type diffusion layers 31 is formed on the p-well 51. A pair of n-type diffusion layers 32 is formed on the p-well 52. An insulation film 4 is formed which extends over the p-type diffusion layers 21, the p-type diffusion regions 22, the n-type diffusion layers 31 and the n-type diffusion layers 32 as well as the n-well 41, the n-well 42, the p-well 51 and the p-well 52, in addition over the deep n-well 5 and the p-type semiconductor substrate 3. Gate electrodes 11 and 12 are formed in the insulation film 4. The gate electrode 11 extends over a ridged portion of the p-well 51 between the paired n-type diffusion layers 31 and a ridged portion of the n-well 41 between the p-type diffusion layers 21. The gate electrode 12 extends over a ridged portion of the n-well 52 between the paired n-type diffusion layers 32 and a ridged portion of the n-well 42 between the p-type diffusion layers 22. Further, the back bias control terminals BP1, BN1, BP2 and BN2 are formed in the insulation layer 4. The back bias control terminal BP1 is provided in contact with a ridged portion of the n-well 41 so that the back bias control terminal BP1 is electrically connected to the n-well 41. The back bias control terminal BN1 is provided in contact with a ridged portion of the p-well 51 so that the back bias control terminal BN1 is electrically connected to the p-well 51. The back bias control terminal BP2 is provided in contact with a ridged portion of the n-well 42 so that the back bias control terminal BP2 is electrically connected to the n-well 42. The back bias control terminal BN2 is provided in contact with a ridged portion of the p-well 52 so that the back bias control terminal BN2 is electrically connected to the p-well 52.

As a result, a p-channel MOS field effect transistor QP1 comprises the n-well 41, the gate electrode 11, the p-type diffusion layers 21 and the back bias control terminal BP1. An n-channel MOS field effect transistor QN1 comprises the p-well 51, the gate electrode 11, the n-type diffusion layers 31 and the back bias control terminal BN1. A p-channel MOS field effect transistor QP2 comprises the n-well 42, the gate electrode 12, the p-type diffusion layers 22 and the back bias control terminal BP2. An n-channel MOS field effect transistor QN2 comprises the p-well 52, the gate electrode 11, the n-type diffusion layers 32 and the back bias control terminal BN2.

Subsequently, operations of the above oscillator circuit will be described. Variation in potential of the well causes a variation in threshold voltage of the MOS field effect transistor by a substrate bias effect. As illustrated in FIG. 6, the individual transistors are formed in the different wells which are electrically isolated from one another so that the back bias control unit 1 is capable of applying back bias control voltages to the individual wells separately whereby the threshold voltages of the individual transistors formed in the individual wells are independently and separately controllable by the back bias control unit 1.

The current driving ability of the each logic gate of the ring-oscillator is decided by an ON-current Ion in the saturation region of the transistor, for which reason the current driving ability of the each logic gate is controllable by controlling the threshold voltage of the transistor. The ON-current Ion is given by the following equation.

$$\text{Ion} = (\beta/2) \times (\text{VGS} - \text{Vth}) \quad (1 < \alpha < 1) \tag{2}$$

Figure 7:
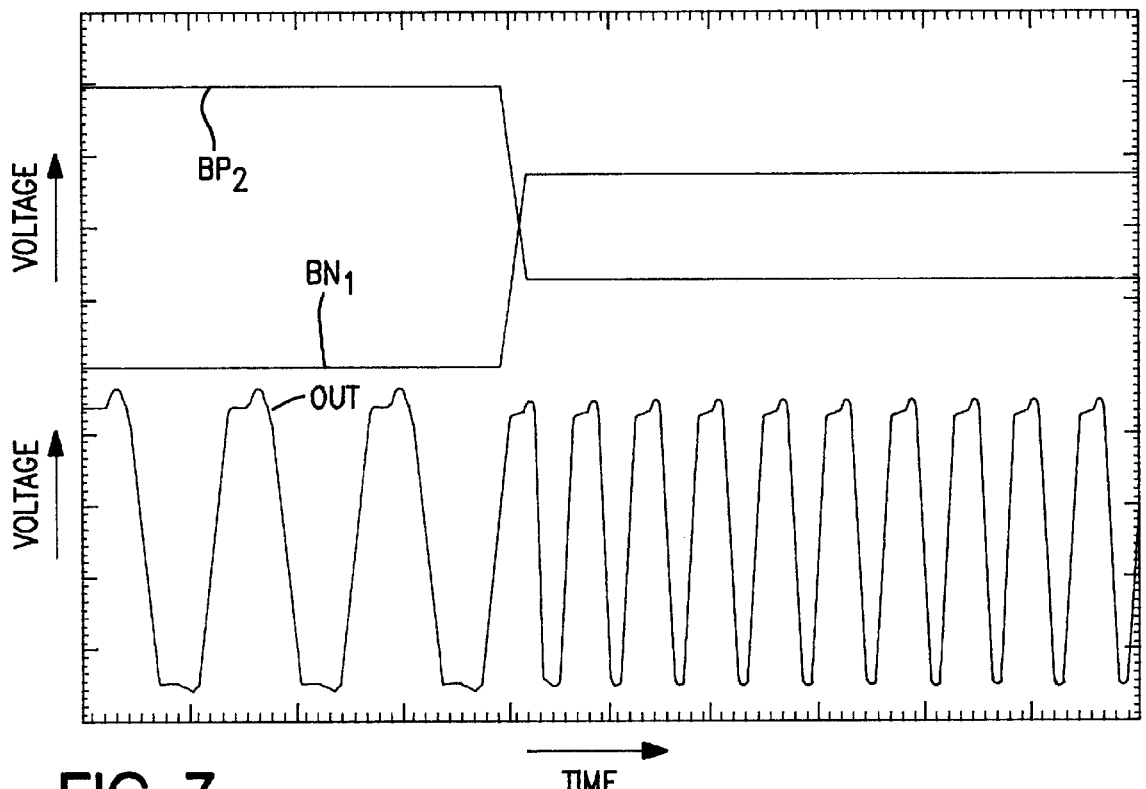
FIG. 7 is a graph illustrative of variations of back bias control voltages BP2 and BN1 as well as the output voltage of the oscillator circuit over time in a first embodiment in accordance with the present invention.
Figure 8:
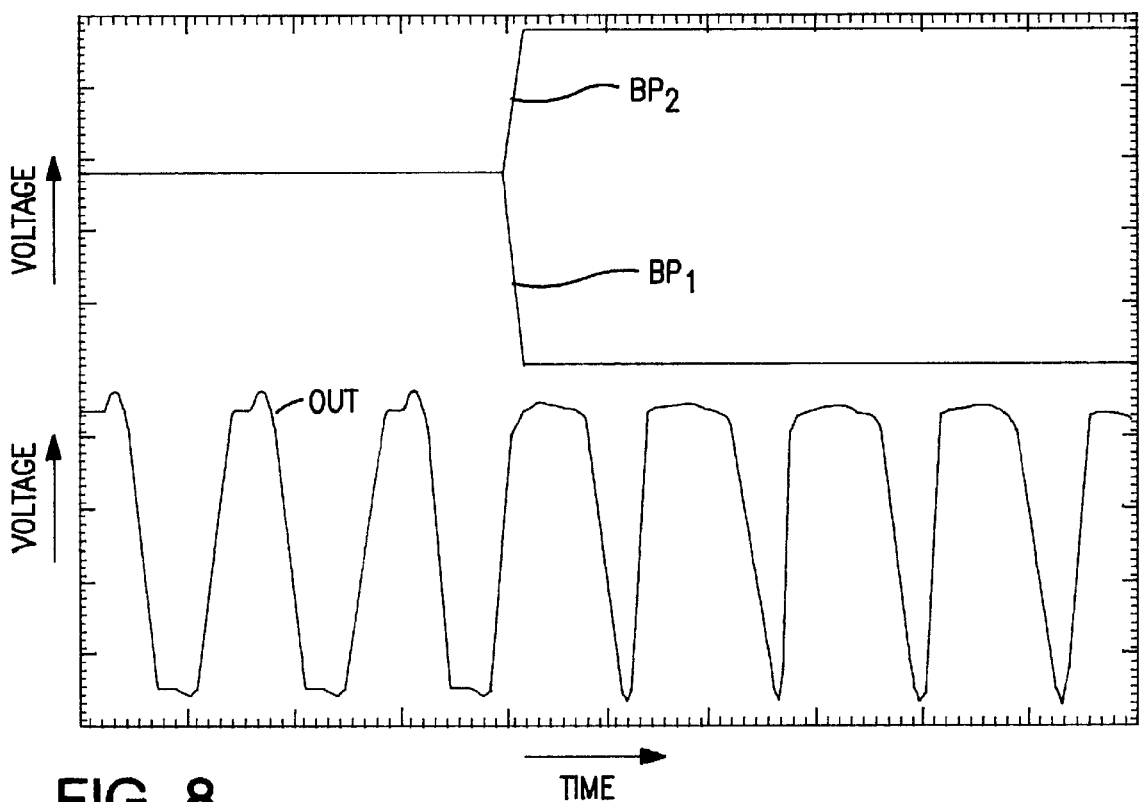
FIG. 8 is also a graph illustrative of variations of back bias control voltages BP1 and BN2 as well as the output voltage of the oscillator circuit over time in a first embodiment in accordance with the present invention.
Figure 9:
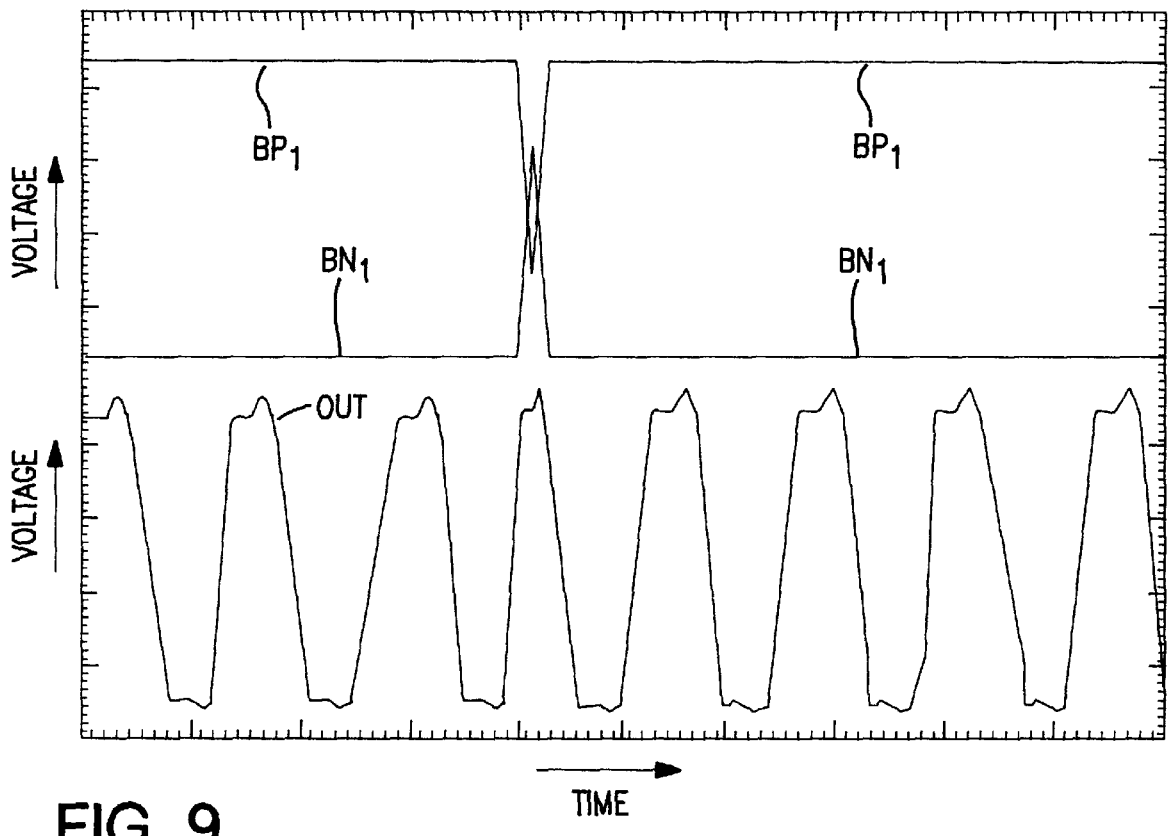
FIG. 9 is also a graph illustrative of variations of back bias control voltages BP1 and BN1 as well as the output voltage of the oscillator circuit over time in a first embodiment in accordance with the present invention.

FIG. 7 is a graph illustrative of variations of back bias control voltages BP2 and BN1 as well as the output voltage of the oscillator circuit over time in a first embodiment in accordance with the present invention. FIG. 8 is also a graph illustrative of variations of back bias control voltages BP1 and BN2 as well as the output voltage of the oscillator circuit over time in a first embodiment in accordance with the present invention. FIG. 9 is also a graph illustrative of variations of back bias control voltages BP1 and BN1 as well as the output voltage of the oscillator circuit over time in a first embodiment in accordance with the present invention.

As illustrated in FIG. 7, the back bias control unit 1 controls the back bias control voltages so that the back bias control voltages BP1, BP2, . . . BP2k+1 are low which are to be applied to the p-channel MOS field effect transistors QP1, QP2, . . . QP2k+1, whilst the back bias control voltages BN1, BN2, . . . BN2k+1 are high which are to be applied to the n-channel MOS field effect transistors QN1, QN2, . . . QN2k+1. As a result, the current driving ability of the invertor on each stage is increased. This makes it possible to increase the oscillation frequency of the oscillator circuit.

As illustrated in FIG. 8, the back bias control unit 1 controls the back bias control voltages so that the back bias control voltages BP1, BN1, BP3, BN3 . . . BP2k+1 and BN2k+1 are low which are to be applied to the p-channel and n-channel MOS field effect transistors QP1, QN1, QP3, QN3, . . . QP2k+1 and QN2k+1 on the odd stages, whilst the back bias control voltages BP2, BN2, BP4, BN4 . . . BP2k and BN2k are high which are to be applied to the p-channel and n-channel MOS field effect transistors QP2, QN2, QP4, QN4, . . . QP2k and QN2k on the even stages. As a result, the delay time of the voltage rise of the output signal is reduced whilst the delay time of the voltage fall of the output signal is increased whereby the duty ratio of the output signal is increased, the current driving ability of the invertor on each stage is increased.

As illustrated in FIG. 9, the back bias control unit 1 controls the back bias control voltages so that, within a shorter time than a period of the oscillation, the back bias control voltages BP1, BP2, . . . BP2k+1 are temporary made low which are to be applied to the p-channel MOS field effect transistors QP1, QP2, . . . QP2k+1, whilst the back bias control voltages BN1, BN2, . . . BN2k+1 are temporary made high which are to be applied to the n-channel MOS field effect transistors QN1, QN2, . . . QN2k+1, and immediately thereafter those back bias control voltages BP1, BP2, . . . BP2k+1, BN1, BN2, . . . BN2k+1 will be returned to the original levels. Namely, the frequency of the oscillator circuit is temporary made high in the shorter time than the oscillation period and immediately thereafter the frequency of the oscillator circuit is returned to the original frequency, for which reason a phase of the output signal from the oscillator circuit is advanced.

Since, however, as illustrated in FIGS. 6A and 6B, p-n junctions are formed between the diffusion layer and the well, and also between the p-well and the deep n-well as well as between the n-well and the p-type semiconductor substrate, it is required that potential of the p-type semiconductor region is higher than a potential of the n-type semiconductor region by not less than a diffusion potential Vf. If, for example, the potential of the p-type semiconductor substrate 3 is reduced to a voltage not higher than a power voltage Vdd, then it is required that the potentials o the n-wells 41 and 42 are higher hand Vdd-Vth. This means that the available range in which the back bias voltage level lies are limited.

The above oscillation circuit provides the following two remarkable effects. The first effect is concerned with a reduction in occupied area of the oscillator circuit because any MOS field effect transistors with any large gate width are never required. The second effect is to allow the oscillator circuit to possess an extremely high oscillation frequency because the ring-oscillator may comprise simply structured invertor circuits and the threshold voltages of the transistors are controllable to be low.

In the above first embodiment in accordance with the present invention, all of the wells individually having every transistors forming the ring-oscillator are electrically isolated from each other. Notwithstanding, as a modification, it may be available that at least any ones of the wells individually having every transistors forming the ring-oscillator are electrically isolated for allowing the back bias voltage control unit to separately control the threshold voltages of the transistors formed in the above at least any ones of the wells.

As a further modification, it is also available that the conductivity types of the semiconductor regions in the oscillator circuit are inverted. For example, the oscillator circuit may be formed on an n-type semiconductor substrate, wherein a deep p-well and a p-well are formed on the n-type semiconductor substrate and an n-well is formed on the deep p-well.

Figure 10:
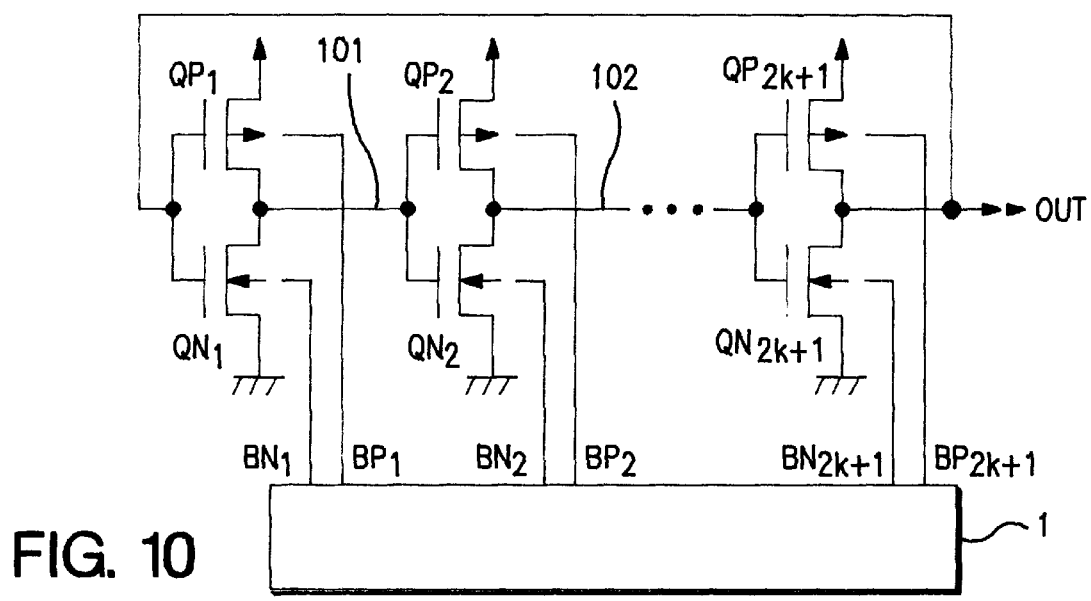
FIG. 10 is a circuit diagram illustrative of a novel oscillator circuit in a second embodiment in accordance with the present invention.

SECOND EMBODIMENT:

A second embodiment according to the present invention will be described, wherein a novel oscillator circuit having transistors formed on a partial depletion silicon-on-insulator substrate is provided. FIG. 10 is a circuit diagram illustrative of a novel oscillator circuit in the second embodiment in accordance with the present invention. The novel oscillator circuit comprises a ring-oscillator circuit which comprises series connection of a plurality of invertors. Each of the invertors comprises a complementary MOS circuit which has a pair of p-channel and n-channel MOS field effect transistors connected in series between a high voltage line and a ground line. The equivalent circuit of the novel oscillator circuit of the second embodiment is the same as in the first embodiment.

Namely, the first stage invertor comprises a series connection of a p-channel MOS field effect transistor QP1 and an n-channel MOS field effect transistor QN1, wherein the p-channel MOS field effect transistor QP1 is connected in series between the high voltage line and an output terminal of the first stage invertor whilst the n-channel MOS field effect transistor QN1 is connected in series between the ground line and the output terminal of the first stage invertor. Gates of the p-channel and n-channel MOS field effect transistors QP1 and QN1 are connected to the input terminal of the first stage invertor.

The second stage invertor comprises a series connection of a p-channel MOS field effect transistor QP2 and an n-channel MOS field effect transistor QN2, wherein the p-channel MOS field effect transistor QP2 is connected in series between the high voltage line and an output terminal of the second stage invertor whilst the n-channel MOS field effect transistor QN2 is connected in series between the ground line and the output terminal of the second stage invertor. Gates of the p-channel and n-channel MOS field effect transistors QP2 and QN2 are connected to the input terminal of the second stage invertor.

The other invertors on the following stages have the same circuit configurations. The final stage invertor on the final stage comprises a series connection of a p-channel MOS field effect transistor QP2k+1 and an n-channel MOS field effect transistor QN2k+1, wherein the p-channel MOS field effect transistor QP2k+1 is connected in series between the high voltage line and an output terminal of the final stage invertor whilst the n-channel MOS field effect transistor QN2k+1 is connected in series between the ground line and the output terminal of the second stage invertor. Gates of the p-channel and n-channel MOS field effect transistors QP2k+1 and QN2k+1 are connected to the input terminal of the final stage invertor. An output terminal of the final stage invertor is connected to the input terminal of the first stage invertor so that the output signal from the final stage invertor is fed back to the first stage invertor.

The above novel oscillator circuit has a back bias control unit 1 which is electrically connected to back bias control terminals BP1, BN1, BP2, BN2, . . . BP2k+1 and BN2k+1. The back bias control unit 1 may have charge pump circuits which generate back bias control voltages.

Figure 11:
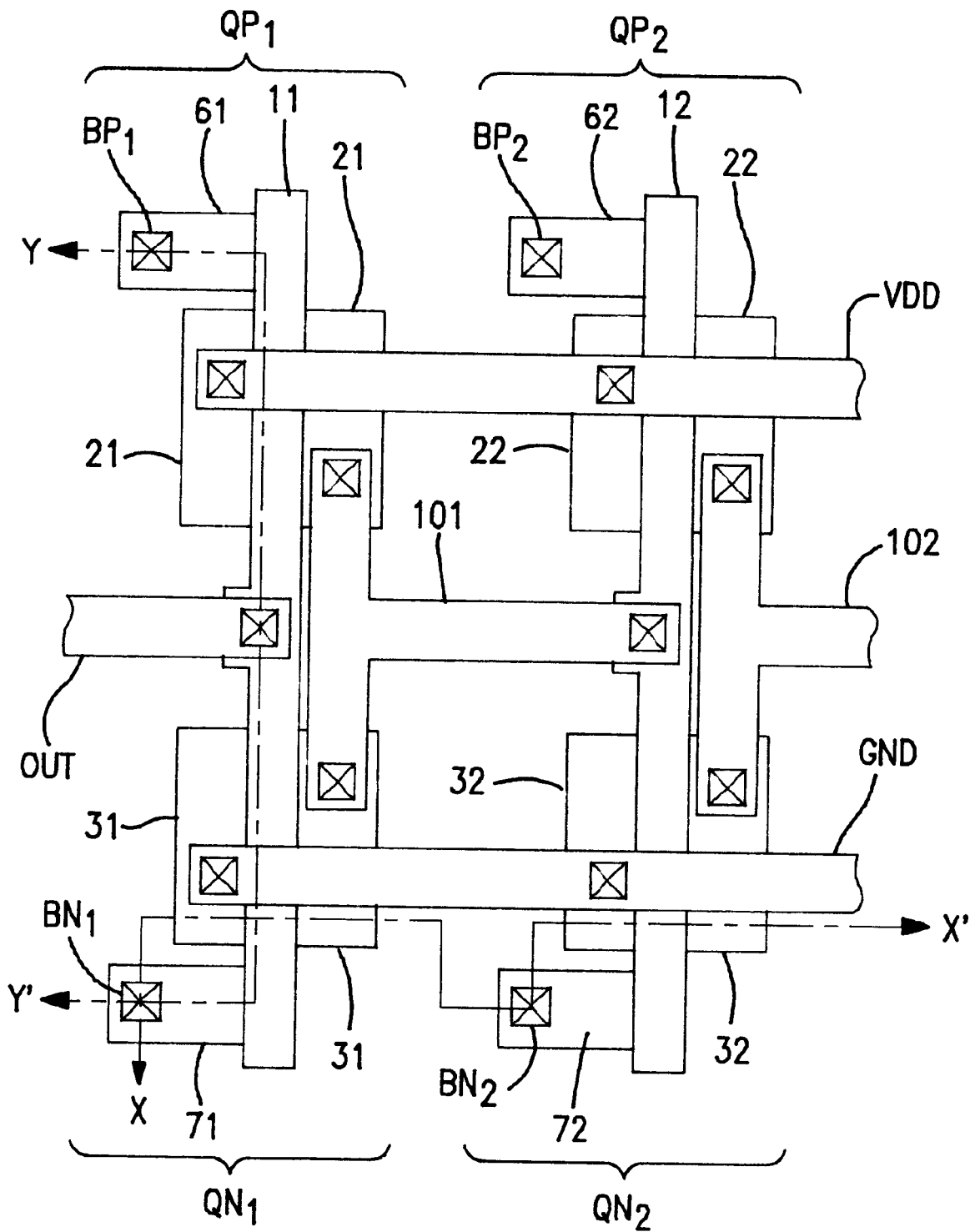
FIG. 11 is a plane view illustrative of the first and second stage invertors on the first and second stages in the oscillator circuit in the second embodiment in accordance with the present invention.
Figure 12A:
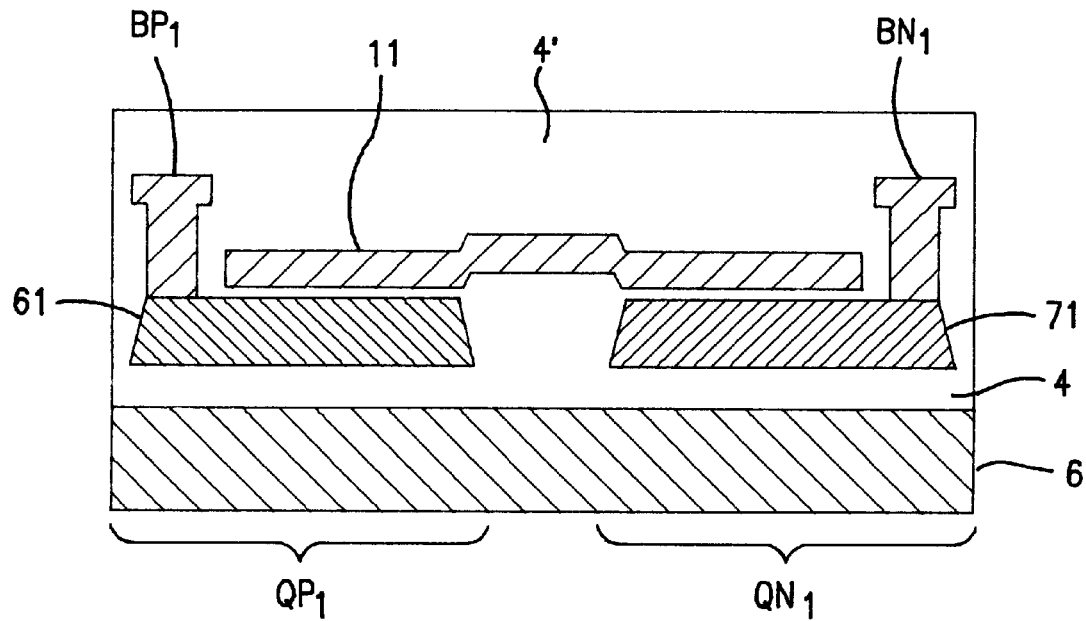
FIG. 12A is a fragmentary cross sectional elevation view taken along Y-Y' line of FIG. 11 illustrative of the first and second stage invertors on the first and second stages in the oscillator circuit in the second embodiment in accordance with the present invention.
Figure 12B:
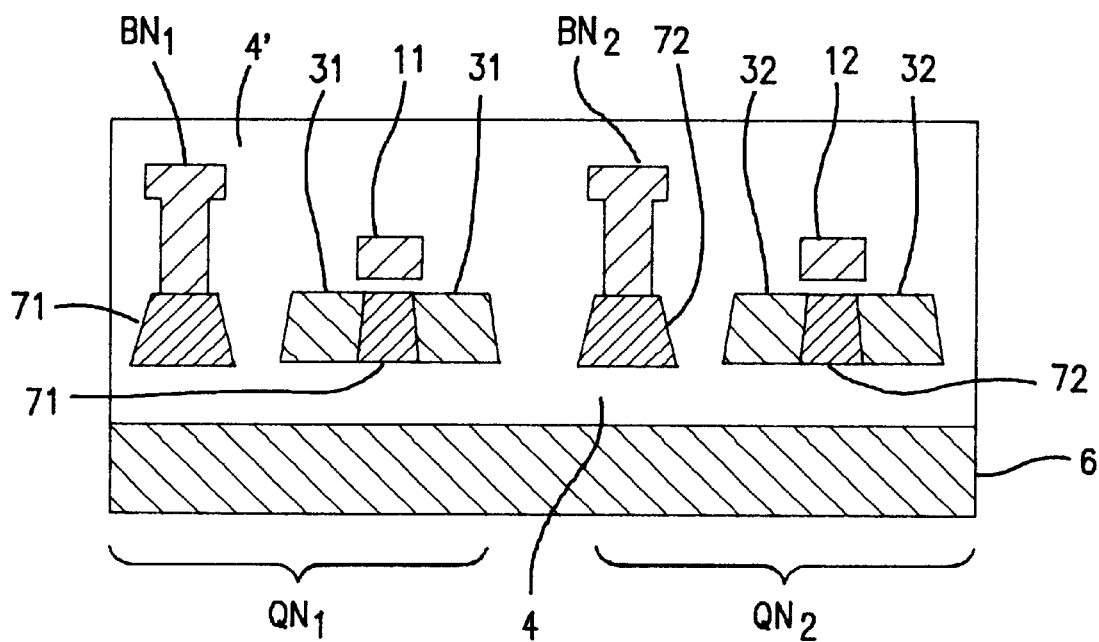
FIG. 12B is a fragmentary cross sectional elevation view taken along X-X' line of FIG. 11 illustrative of the first and second stage invertors on the first and second stages in the oscillator circuit in the second embodiment in accordance with the present invention.

FIG. 11 is a plane view illustrative of the first and second stage invertors on the first and second stages in the oscillator circuit in the second embodiment in accordance with the present invention. FIG. 12A is a fragmentary cross sectional elevation view taken along Y-Y' line of FIG. 11 illustrative of the first and second stage invertors on the first and second stages in the oscillator circuit in the second embodiment in accordance with the present invention. FIG. 12B is a fragmentary cross sectional elevation view taken along X-X' line of FIG. 11 illustrative of the first and second stage invertors on the first and second stages in the oscillator circuit in the second embodiment in accordance with the present invention.

An insulation film 4 is formed which extends over a semiconductor substrate 6. The semiconductor substrate 6 may be either of n-type and p-type. Further, n-type silicon-on-insulator layers 61 and 62 and p-type silicon-on-insulator layers 71 and 72 are selectively formed on the insualtion film 4 to form the silicon-on-insulator structure. The n-type silicon-on-insulator layer 61, and the p-type silicon-on-insulator layers 71 and 72 are isolated from each other by the insulation film 4. A pair of p-type diffusion layers 21 are provided in the opposite sides of the n-type silicon-on-insulator layer 61. A pair of p-type diffusion layers 22 are provided in the opposite sides of the n-type silicon-on-insulator layer 62. A pair of n-type diffusion layers 31 are provided in the opposite sides of the p-type silicon-on-insulator layer 71. A pair of n-type diffusion layers 32 are provided in the opposite sides of the p-type silicon-on-insulator layer 72. Further, an insulation film 4' is provided which extends over the n-type silicon-on-insulator layers 61 and 62 and the p-type silicon-on-insulator layers 71 and 72 as well as over the insulation layer 4. Gate electrodes 11 and 12 are formed in the insulation film 4' so that the gate electrode 11 extends over the n-type silicon-on-insulator layer 61 between the p-type diffusion layers 21 and over the p-type silicon-on-insulator layer 71 between the n-type diffusion layers 31 whilst the gate electrode 12 extends over the n-type silicon-on-insulator layer 62 between the p-type diffusion layers 22 and over the p-type silicon-on-insulator layer 72 between the n-type diffusion layers 32. Back bias control terminals BP1, BN1, BP2 and BN2 are also formed in the insulation film 4'. The back gate control terminal BP1 is provided in contact with the n-type silicon-on-insulator layer 61 so that the back gate control terminal BP1 is electrically connected to the n-type silicon-on-insulator layer 61. The back gate control terminal BN1 is provided in contact with the p-type silicon-on-insulator layer 71 so that the back gate control terminal BN1 is electrically connected to the p-type silicon-on-insulator layer 71. The back gate control terminal BP2 is provided in contact with the n-type silicon-on-insulator layer 62 so that the back gate control terminal BP2 is electrically connected to the n-type silicon-on-insulator layer 62. The back gate control terminal BN2 is provided in contact with the p-type silicon-on-insulator layer 72 so that the back gate control terminal BN2 is electrically connected to the p-type silicon-on-insulator layer 72.

Subsequently, operations of the above oscillator circuit of the second embodiment will be described. The operations of the above oscillator circuit of the second embodiment are basically the same as in the first embodiment. As compared to when the transistors are formed in the wells, the silicon-on-insulator structure has a small parasitic capacitance. This makes it easy to accomplish high speed variations in oscillation frequency, duty ratio and phase of the oscillator circuit. Further, it is easy to reduce the power consumption.

The above oscillation circuit provides the following two remarkable effects. The first effect is concerned with a reduction in occupied area of the oscillator circuit because any MOS field effect transistors with any large gate width are never required. The second effect is to allow the oscillator circuit to possess an extremely high oscillation frequency because the ring-oscillator may comprise simply structured invertor circuits and the threshold voltages of the transistors are controllable to be low.

Further, the silicon-on-insulator layers 61 62, 71 and 72 are isolated by the insulation film 4 from the semiconductor substrate 6, for which reason potentials of the silicon-on-insulator layers 61 62, 71 and 72 which partially serve as channel regions under the gate electrodes 11 and 12 are free from any influence of the potential of the semiconductor substrate 6. This means that the available range of the back bias control voltage level is widen as compared to when the transistors are formed in the wells.

As a modification, it is also available that the conductivity types of the semiconductor regions in the oscillator circuit are inverted.

Figure 13:
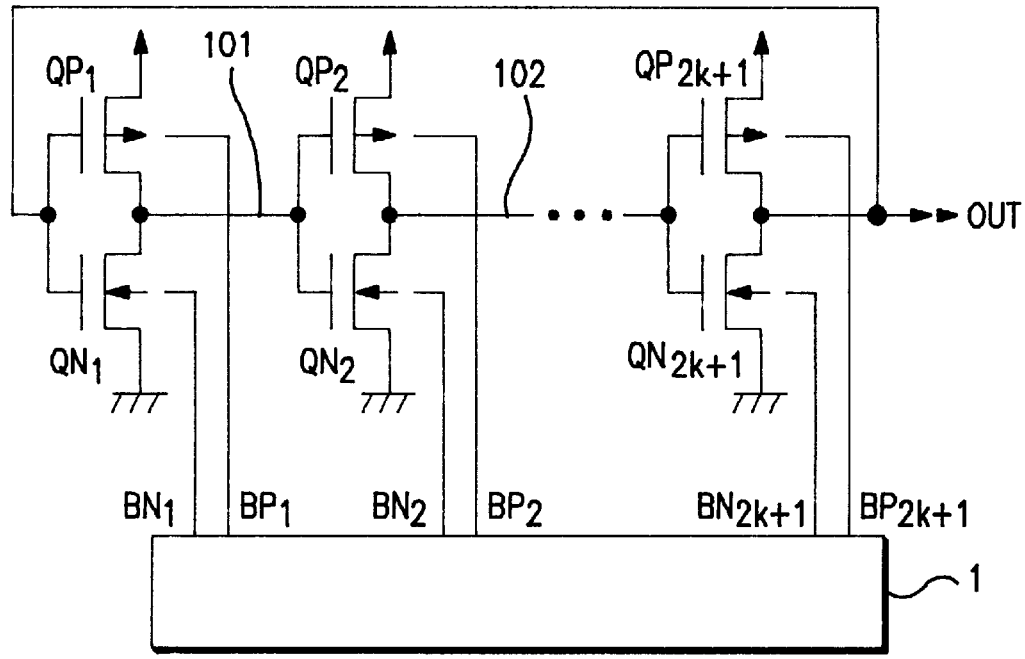
FIG. 13 is a circuit diagram illustrative of a novel oscillator circuit in a second embodiment in accordance with the present invention.

THIRD EMBODIMENT:

A third embodiment according to the present invention will be described, wherein a novel oscillator circuit having transistors formed on a complete depletion silicon-on-insulator substrate is provided. FIG. 13 is a circuit diagram illustrative of a novel oscillator circuit in the third embodiment in accordance with the present invention. The novel oscillator circuit comprises a ring-oscillator circuit which comprises series connection of a plurality of invertors. Each of the invertors comprises a complementary MOS circuit which has a pair of p-channel and n-channel MOS field effect transistors connected in series between a high voltage line and a ground line. The equivalent circuit of the novel oscillator circuit of the third embodiment is the same as in the first embodiment.

Namely, the first stage invertor comprises a series connection of a p-channel MOS field effect transistor QP1 and an n-channel MOS field effect transistor QN1, wherein the p-channel MOS field effect transistor QP1 s connected in series between the high voltage line and an output terminal of the first stage invertor whilst the n-channel MOS field effect transistor QN1 is connected in series between the ground line and the output terminal of the first stage invertor. Gates of the p-channel and n-channel MS field effect transistors QP1 and QN1 are connected to the input terminal of the first stage invertor.

The second stage invertor comprises a series connection of a p-channel MOS field effect transistor QP2 and an n-channel MOS field effect transistor QN2, wherein the p-channel MOS field effect transistor QP2 is connected in series between the high voltage line and an output terminal of the second stage invertor whilst the n-channel MOS field effect transistor QN2 is connected in series between the ground line and the output terminal of the second stage invertor. Gates of the p-channel and n-channel MOS field effect transistors QP2 and QN2 are connected to the input terminal of the second stage invertor.

The other invertors on the following stage shave the same circuit configurations. The final stage invertor on the final stage comprises a series connection of a p-channel MSO field effect transistor QP2k+1 and an n-channel MOS field effect transistor QN2k+1, wherein the p-channel MOS field effect transistor QP2k+1 is connected in series between the high voltage line and an output terminal of the final stage invertor whilst the n-channel MOS field effect transistor QN2k+1 is connected in series between the ground line and the output terminal of the second stage invertor. Gates of the p-channel and n-channel MOS field effect transistors QP2k+1 and QN2k+1 are connected to the input terminal of the final stage invertor. An output terminal of the final stage invertor is connected to the input terminal on the first stage invertor so that the output signal from the final stage invertor is fed back to the first stage invertor.

The above novel oscillator circuit has a back bias control unit 1 which is electrically connected to back bias control terminals BP1, BN1, BP2, BN2, . . . BP2k+1 and BN2k+1. The back bias control unit 1 may have charge pump circuits which generate back bias control voltages.

Figure 14:
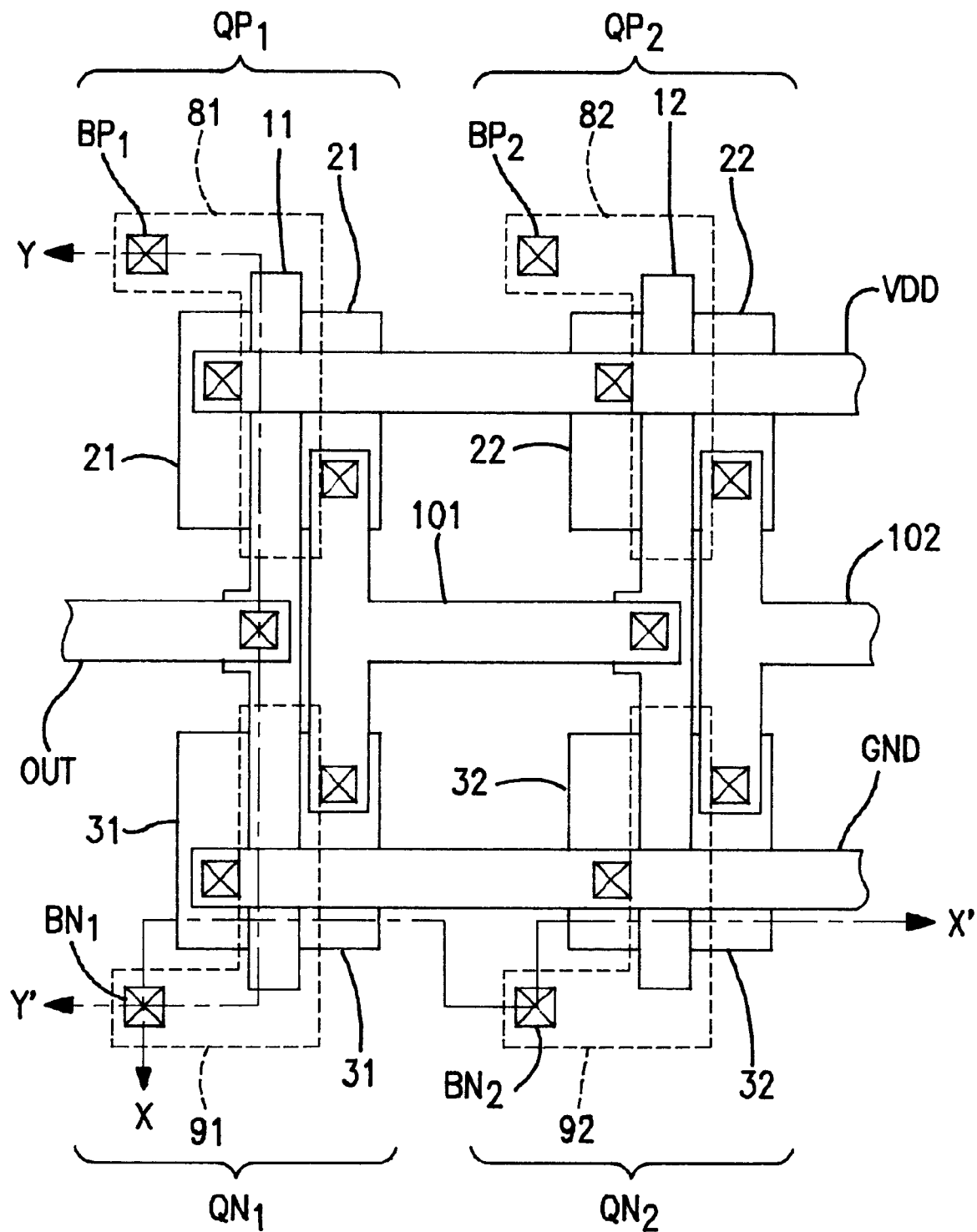
FIG. 14 is a plane view illustrative of the first and second stage invertors on the first and second stages in the oscillator circuit in the third embodiment in accordance with the present invention.
Figure 15A:
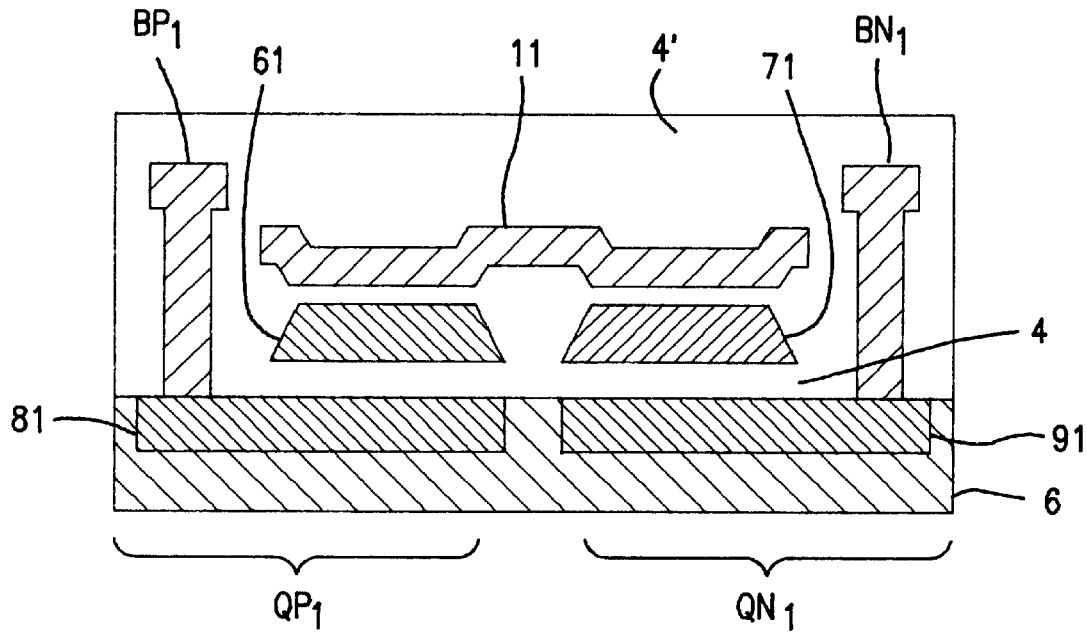
FIG. 15A is a fragmentary cross sectional elevation view taken along Y-Y' line of FIG. 14 illustrative of the first and second stage invertors on the first and second stages in the oscillator circuit in the third embodiment in accordance with the present invention.
Figure 15B:
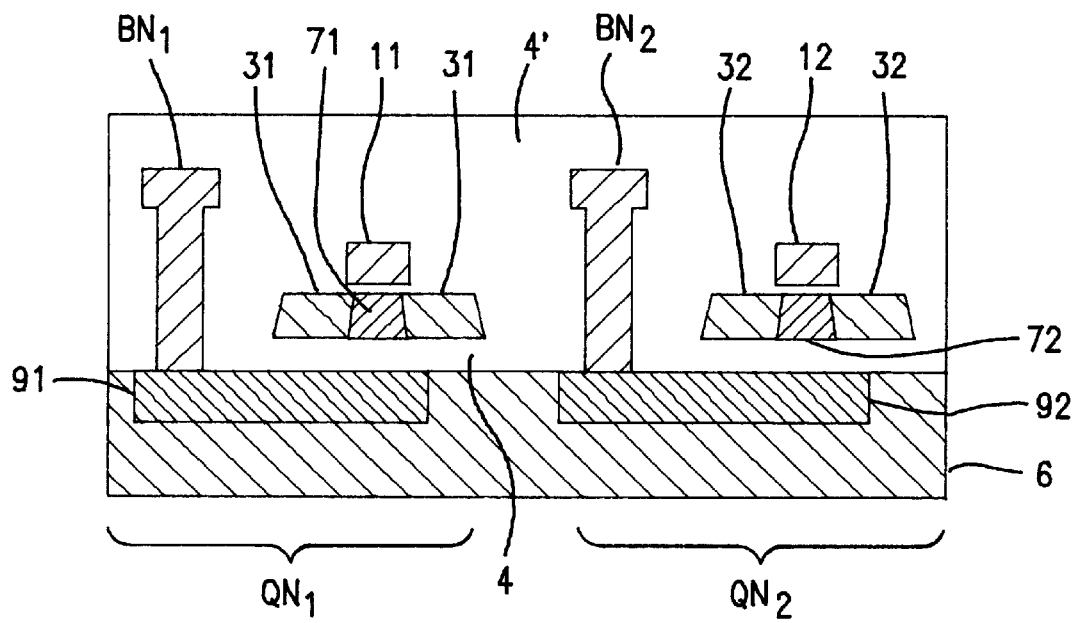
FIG. 15B is a fragmentary cross sectional elevation view taken along X-X' line of FIG. 14 illustrative of the first and second stage invertors on the first and second stages in the oscillator circuit in the third embodiment in accordance with the present invention.

FIG. 14 is a plane view illustrative of the first and second stage invertors on the first and second stages in the oscillator circuit in the third embodiment in accordance with the present invention. FIG. 15A is a fragmentary cross sectional elevation view taken along Y-Y' line of FIG. 14 illustrative of the first and second stage invertors on the first and second stages in the oscillator circuit in the third embodiment in accordance with the present invention. FIG. 15B is a fragmentary cross sectional elevation view taken along X-X' line of FIG. 14 illustrative of the first and second stage invertors on the first and second stages in the oscillator circuit in the third embodiment in accordance with the present invention.

An insulation film 4 is formed which extends over a semiconductor substrate 6. The semiconductor substrate 6 may be either of n-type and p-type. Further, n-type silicon-on-insulator layers 61 and 62 and p-type silicon-on-insulator layers 71 and 72 are selectively formed on the insulation film 4 to form the silicon-on-insulator structure. The n-type silicon-on-insulator layer 61, and the p-type silicon-on-insulator layers 71 and 72 are isolated from each other by the insulation film 4. A pair of p-type diffusion layers 21 are provided in the opposite sides of the n-type silicon-on-insulator layer 61. A pair of p-type diffusion layers 22 are provided in the opposite sides of the n-type silicon-on-insulator layer 62. A pair of n-type diffusion layers 31 are provided in the opposite sides of the p-type silicon-on-insulator layer 71. A pair of n-type diffusion layers 32 are provided in the opposite sides of the p-type silicon-on-insulator layer 72. Further, an insulation film 4' is provided which extends over the n-type silicon-on-insulator layers 61 and 62 and the p-type silicon-on-insulator layers 71 and 72 as well as over the insulation layer 4. Gate electrodes 11 and 12 are formed in the insulation film 4' so that the gate electrode 11 extends over the n-type silicon-on-insulator layer 61 between the p-type diffusion layers 21 and over the p-type silicon-on-insulator layer 71 between the n-type diffusion layers 31 whilst the gate electrode 12 extends over the n-type silicon-on-insulator layer 62 between the p-type diffusion layers 22 and over the p-type silicon-on-insulator layer 72 between the n-type diffusion layers 32. Back bias control terminals BP1, BN1, BP2 and BN2 are also formed in the insulation film 4'. Further, back gates 81, 82, 91 and 92 are formed in an upper region of the semiconductor substrate 6 so that the top surfaces of the back gates 81, 82, 91 and 92 are the same level as the top surface of the semiconductor substrate 6. Namely, the back gates 81, 82, 91 and 92 are formed beneath the insulation film 4 so that the back gates 81, 82, 91 and 92 are isolated by the insulation film 4 from the n-type silicon-on-insulator layers 61 and 62 and from the p-type silicon-on-insulator layers 71 and 72. The back gates 81, 82, 91 and 92 comprise semiconductor layers having opposite conductivity type to that of the semiconductor substrate 6. The back gate 81 is positioned under the n-type silicon-on-insulator layer 61 between the p-type diffusion layers 21. The back gate 82 is positioned under the n-type silicon-on-insulator layer 62 between the p-type diffusion layers 22. The back gate 91 is positioned under the p-type silicon-on-insulator layer 71 between the n-type diffusion layers 31. The back gate 92 is positioned under the p-type silicon-on-insulator layer 72 between the n-type diffusion layers 32. The back gate control terminal BP1 is provided in contact with the back gate 81 so that the back gate control terminal BP1 is electrically connected to the back gate 81. The back gate control terminal BN1 is provided in contact with the back gate 91 so that the back gate control terminal BN1 is electrically connected to the back gate 91. The back gate control terminal BP2 is provided in contact with the back gate 82 so that the back gate control terminal BP2 is electrically connected to the back gate 82. The back gate control terminal BN2 is provided in contact with the back gate 92 so that the back gate control terminal BN2 is electrically connected to the back gate 92.

Subsequently, operations of the above oscillator circuit of the second embodiment will be described. The operations of the above oscillator circuit of the third embodiment are basically the same as in the first embodiment. As compared to when the transistors are formed in the wells, the back gate structure has a small capacitance. This makes it easy to accomplish high sped variations in oscillation frequency, duty ratio and phase of the oscillator circuit. Further, it is easy to reduce the power consumption.

The above oscillation circuit provides the following two remarkable effects. The first effect is concerned with a reduction in occupied area of the oscillator circuit because any MOS field effect transistors with any large gate width are never required. The second effect is to allow the oscillator circuit to possess an extremely high oscillation frequency because the ring-oscillator may comprise simply structured invertor circuits and the threshold voltages of the transistors are controllable to be low.

Further, the silicon-on-insulator layers 61 62, 71 and 72 are isolated by the insulation film 4 from the back gates 81, 82, 91 and 92, for which reason potentials of the back gates 81, 82 91 and 92 are free from any influence of the potentials of the silicon-on-insulator layers 61 62, 71 and 72. This means that the available range of the back gas control voltage level is widen as compared to when the transistors are formed in the wells.

As a modification, it is also available that the conductivity types of the semiconductor regions in the oscillator circuit are inverted.

Figure 16:
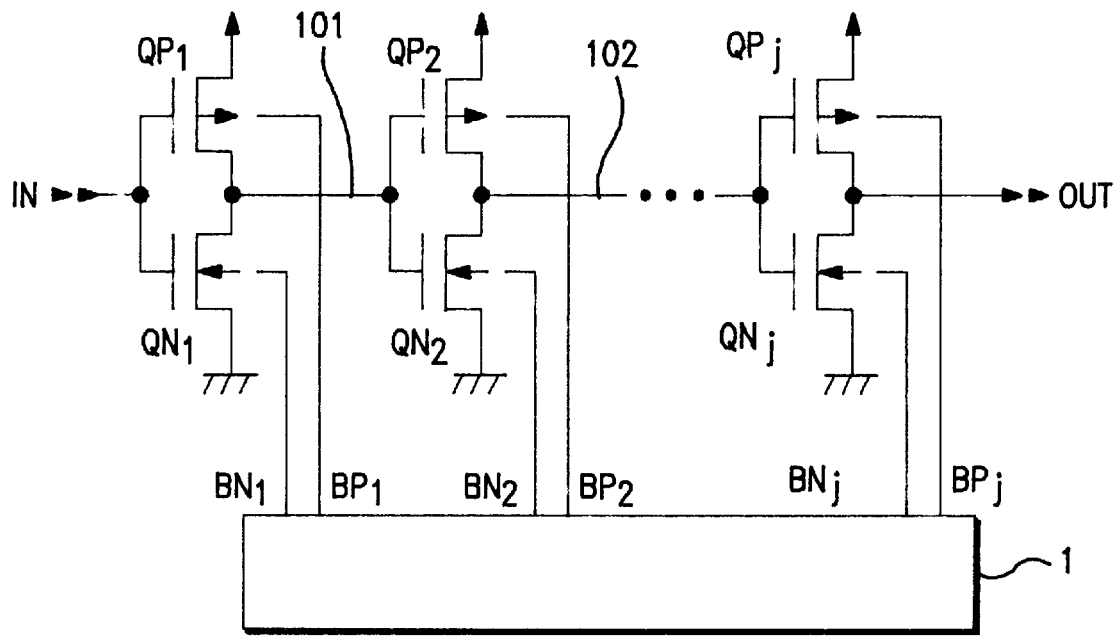
FIG. 16 is a circuit diagram illustrative of a novel oscillator circuit in a fourth embodiment in accordance with the present invention.

FOURTH EMBODIMENT:

A fourth embodiment according to the present invention will be described wherein a novel delay circuit having bulk CMOS circuits is provided. FIG. 16 is a circuit diagram illustrative of a novel delay circuit in the fourth embodiment in accordance with the present invention. The novel delay circuit comprises series connection of a plurality of invertors on even stages "j". Each of the invertors comprises s complementary MOS circuit which has a pair of p-channel and n-channel MOS field effect transistors connected in series between a high voltage line and a ground line.

The first stage invertor comprises a series connection of a p-channel MOS field effect transistor QP1 and an n-channel MOS field effect transistor QN1, wherein the p-channel MOS field effect transistor QP1 is connected in series between the high voltage line and an output terminal of the first stage invertor whilst the n-channel MOS field effect transistor QN1 is connected in series between the ground line and the output terminal of the first stage invertor. Gates of the p-channel and n-channel MOS field effect transistors QP1 and QN1 are connected to the input terminal of the first stage invertor.

The second stage invertor comprises a series connection of a p-channel MOS field effect transistor QP2 and an n-channel MOS field effect transistor QN2, wherein the p-channel MOS field effect transistor QP2 is connected in series between the high voltage line and an output terminal of the second stage invertor whilst the n-channel MOS field effect transistor QN2 is connected in series between the ground line and the output terminal of the second stage invertor. Gates of the p-channel and n-channel MOS field effect transistors QP2 and QN2 are connected to the input terminal of the second stage invertor.

The other invertors on the following stages have the same circuit configurations. The final stage invertor on the final stage comprises a series connection of a p-channel MOS field effect transistor QPj and an n-channel MOS field effect transistor QNj, wherein the p-channel MOS field effect transistor QPj is connected in series between the high voltage line and an output terminal of the final stage invertor whilst the n-channel MOS field effect transistor QNj is connected in series between the ground line and the output terminal of the second stage invertor. Gates of the p-channel and n-channel MOS field effect transistors QPj and QNj are connected to the input terminal of the final stage invertor.

The above novel delay circuit has a back bias control unit 1 which is electrically connected to back bias control terminals BP1, BN1, BP2, BN2, . . . BPj and BNj. The back bias control terminals are further electrically connected to individual wells in which the individual p-channel and n-channel MOS field effect transistors are formed. The individual wells are electrically isolated from each other so that the back bias control unit 1 applies back bias control voltages to the individual wells separately. The back bias control unit 1 may have charge pump circuits which generate back bias control voltages.

The individual wells in which the p-channel and n-channel MOS field effect transistors QP1, QN1, QP2, QN2, . . . QPj and QNj are formed are electrically isolated from each other and also electrically connected to the individual back bias control terminals BP1, BN1, BP2, BN2, BPj and BNj.

Figure 17:
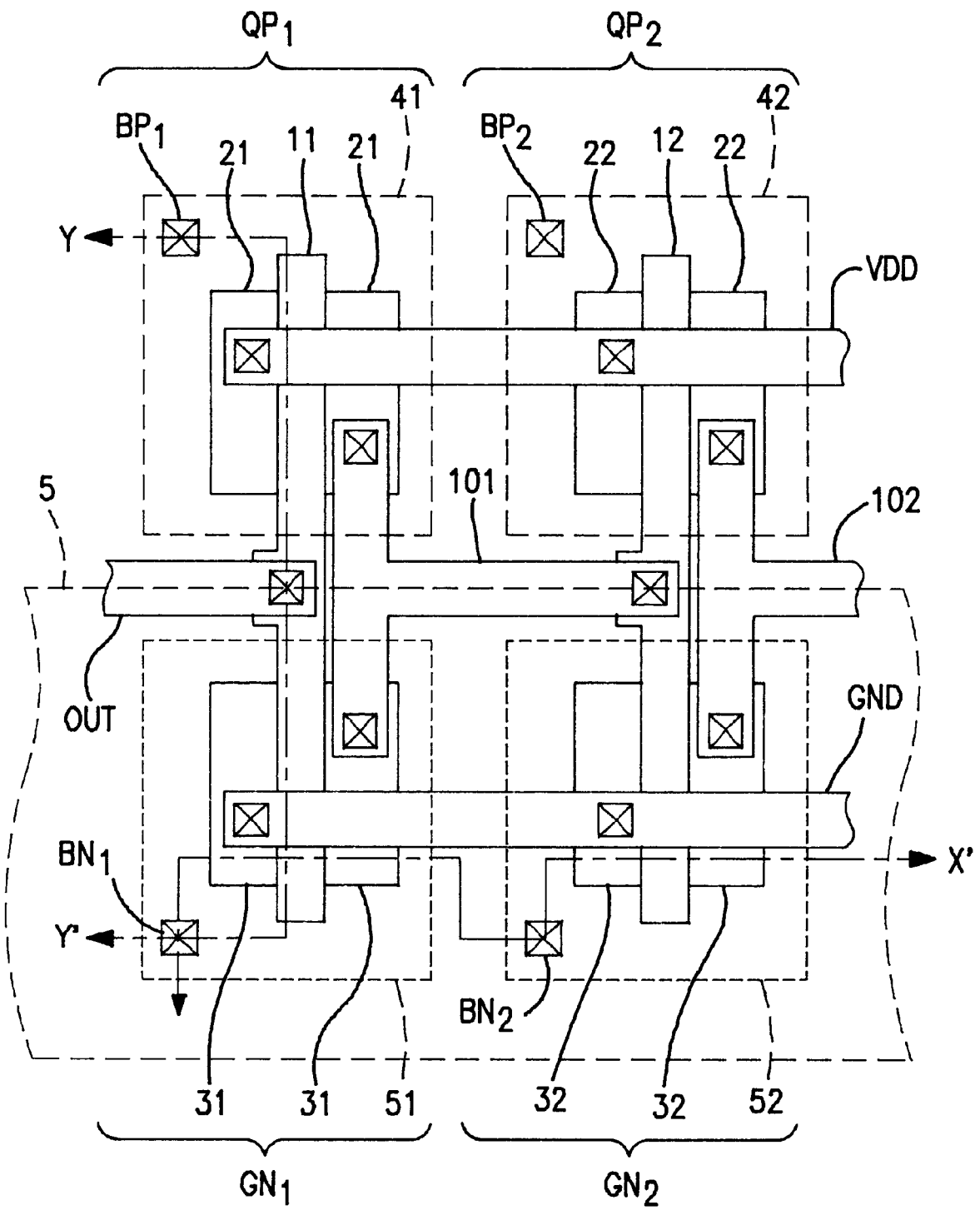
FIG. 17 is a plane view illustrative of the first and second stage invertors on the first and second stages in the delay circuit in the fourth embodiment in accordance with the present invention.
Figure 18A:
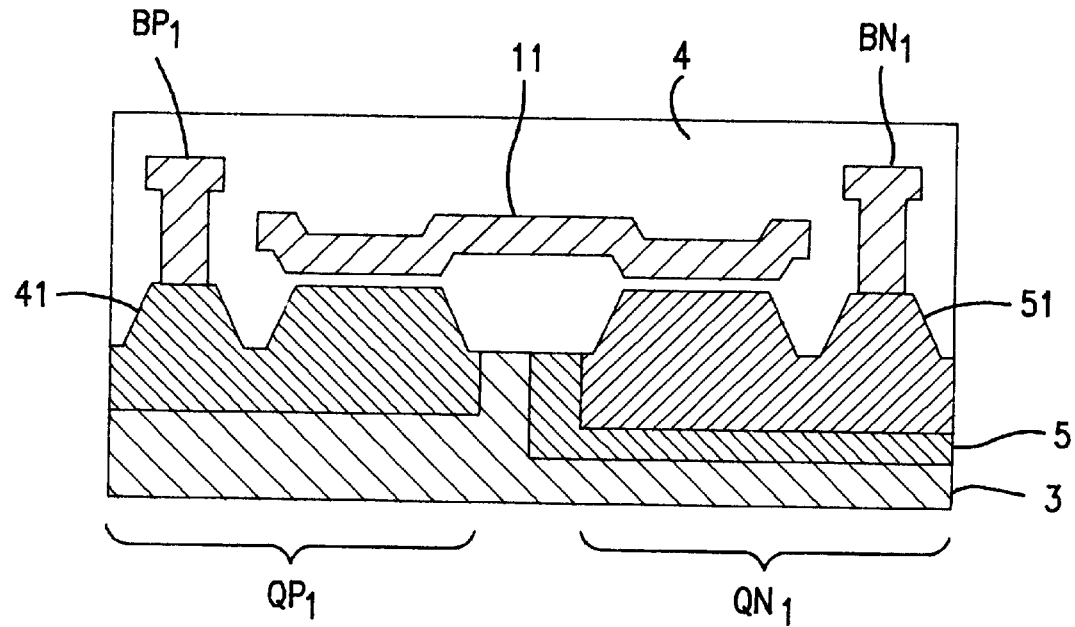
FIG. 18A is a fragmentary cross sectional elevation view taken along Y-Y' line of FIG. 17 illustrative of the first and second stage invertors on the first and second stage sin the delay circuit in the fourth embodiment in accordance with the present invention.
Figure 18B:
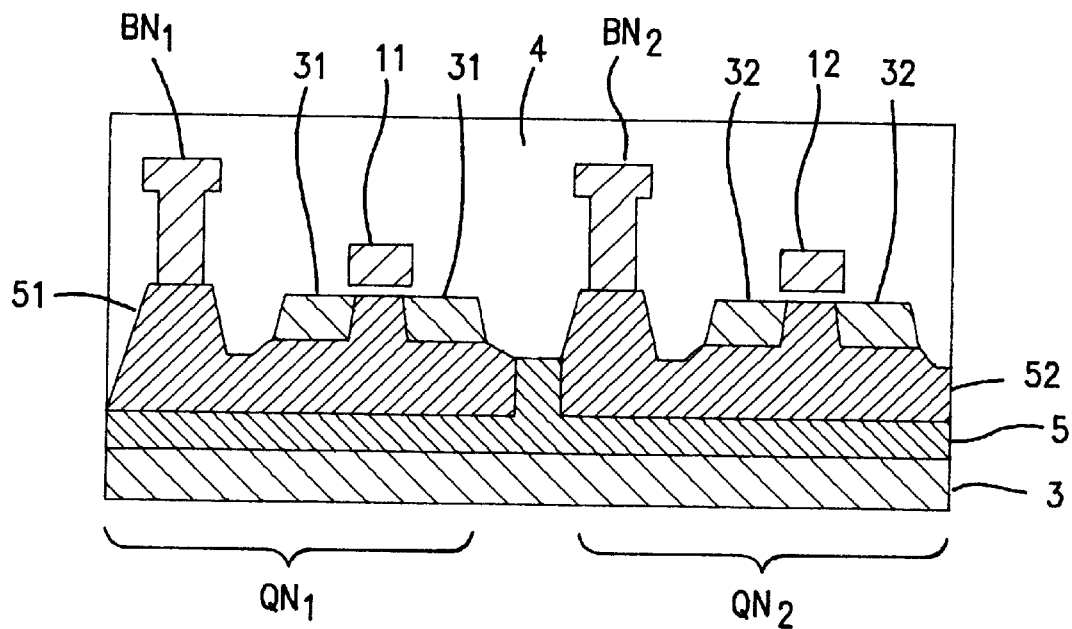
FIG. 18B is a fragmentary cross sectional elevation view taken along X-X' line of FIG. 17 illustrative of the first and second stage invertors on the first and second stages in the delay circuit in the fourth embodiment in accordance with the present invention.

FIG. 17 is a plane view illustrative of the first and second stage invertors on the first and second stages in the delay circuit in the fourth embodiment in accordance with the present invention. FIG. 18A is a fragmentary cross sectional elevation view taken along Y-Y' line of FIG. 17 illustrative of the first and second stage invertors on the first and second stages in the delay circuit in the fourth embodiment in accordance with the present invention. FIG. 18B is a fragmentary cross sectional elevation view taken along X-X' line of FIG. 17 illustrative of the first and second stage invertors on the first and second stage in the delay circuit in the fourth embodiment in accordance with the present invention.

The first and second stage invertors are formed on a p-type semiconductor substrate 3. An n-well 41, an n-well 42 and a deep n-well 5 are selectively formed in an upper region of the p-type semiconductor substrate 3 so tat the n-wells 42 and the deep n-well 5 are isolated from each other by the p-type semiconductor substrate 3. Further, p-wells 51 and 52 are formed on the deep n-well 5 so that the p-wells 51 and 52 are isolated from each other by the deep n-well 5. A pair of p-type diffusion layers 21 is formed on the n-well 41. A pair of p-type diffusion regions 22 is formed on the n-well 42. A pair of n-type diffusion layers 31 is formed on the p-well 51. A pair of n-type diffusion layers 32 is formed on the p-well 52. An insulation film 4 is formed which extends over the p-type diffusion layers 21, the p-type diffusion regions 22, the n-type diffusion layers 31 and the n-type diffusion layers 32 as well s the n-well 41, the n-well 42, the p-well 51 and the p-well 52, in addition over the deep n-well 5 and the p-type semiconductor substrate 3. Gate electrodes 11 and 12 are formed in the insulation film 4. The gate electrode 11 extends over a ridged portion of the p-well 51 between the paired n-type diffusion layers 31 and a ridged portion of the n-well 41 between the p-type diffusion layers 21. The gate electrode 12 extends over a ridged portion of the n-well 52 between the paired n-type diffusion layers 32 and a ridged portion of the n-well 42 between the p-type diffusion layers 22. Further, the back bias control terminals BP1, BN1, BP2 and BN2 are formed in the insulation layer 4. The back bias control terminal BP1 is provided in contact with a ridged portion of the n-well 41 so that the back bias control terminal BP1 is electrically connected to the n-well 41. The back bias control terminal BN1 is provided in contact with a ridged portion of the p-well 51 so that the back bias control terminal BN1 is electrically connected to the p-well 51. The back bias control terminal BP2 is provided in contact with a ridged portion of the n-well 42 so that the back bias control terminal BP2 is electrically connected to the n-well 42. The back bias control terminal BN2 is provided in contact with a ridged portion of the p-well 52 so that the back bias control terminal BN2 is electrically connected to the p-well 52.

As a result, a p-channel MOS field effect transistor QP1 comprises the n-well 41, the gate electrode 11, the p-type diffusion layers 21 and the back bias control terminal BP1. An n-channel MOS field effect transistor QN1 comprises the p-well 51, the gate electrode 11, the n-type diffusion layers 31 and the back bias control terminal BN1. A p-channel MOS field effect transistor QP2 comprises then-well 42, the gate electrode 12, the p-type diffusion layers 22 and the back bias control terminal BP2. An n-channel MOS field effect transistor QN2 comprises the p-well 52, the gate electrode 11, the n-type diffusion layers 32 and the back bias control terminal BN2.

Subsequently, operations of the above delay circuit will be described. Variation in potential of the well causes a variation in threshold voltage of the MOS field effect transistor by a substrate bias effect. The individual transistors are formed in the different wells which are electrically isolated from one another so that the back bias control unit 1 is capable of applying back bias control voltages to the individual wells separately whereby the threshold voltages of the individual transistors formed in the individual wells are independently and separately controllable by the back bias control unit 1.

The current driving ability of the each logic gate is decided by an ON-current Ion in the saturation region of the transistor, for which reason the current driving ability of the each logic gate is controllable by controlling the threshold voltage of the transistor. The ON-current Ion is given by the above equation (2).

The back bias control unit 1 controls the back bias control voltages so that the back bias control voltages BP1, BP2, . . . BPj are high which are to be applied to the p-channel MOS field effect transistors QP1, QP2, . . . QPj, whilst the back bias control voltages BN1, BN2, . . . BN are low which are to be applied to the n-channel MOS field effect transistors QN1, QN2, . . . QNj. As a result, the current driving ability of the invertor on each stage is decreased. This makes it possible to increase the delay time of the delay circuit.

The back bias control unit 1 may also control the back bias control voltages so that the back bias control voltages BP1, BN1, BP3, BN3 . . . BPj−1 and BNj−1 are low which are to be applied to the p-channel and n-channel MOS field effect transistors QP1, QN1, QP3, QN3, . . . QPj−1 and QNj−1 on the odd stages, whilst the back bias control voltages BP2, BN2, BP4, BN4 . . . BPj and BNj are high which are to be applied to the p-channel and n-channel MOS field effect transistors QP2, QN2, QP4, QN4, . . . QPj and QNj on the even stages. As a result, the delay time of the voltage rise of the output signal is increased whilst the delay time of the voltage fall of the output signal is reduced. Accordingly, the delay time is controllable by the back bias control unit 1.

The back bias control unit 1 may also control the back bias control voltages so that the back bias control voltages BP1, BN1, BP3, BN3 . . . BPj−1 and BNj−1 are high which are to be applied to the p-channel and n-channel MOS field effect transistors QP1, QN1, QP3, QN3, . . . QPj−1 and QNj−1 on the odd stages, whilst the back bias control voltages BP2, BN2, BP4, BN4 . . . BPj and BNj are low which are to be applied to the p-channel and n-channel MOS field effect transistors QP2, QN2, QP4, QN4, . . . QPj and QNj on the even stages. As a result, the delay time of the voltage rise of the output signal is reduced whilst the delay time of the voltage fall of the output signal is increased. Accordingly, the delay time is controllable by the back bias control unit 1.

The above delay circuit provides the following two remarkable effects. The first effect is concerned with a reduction in occupied area of the delay circuit because any MSO field effect transistors with any large gate width are never required. The second effect is to allow the delay circuit to vary the delay time, the rise time and the fall time. Namely, the delay time is controllable on operation of the delay circuit because the delay time is controllable by the back bias control unit.

In the above fourth embodiment in accordance with the present invention, all of the wells individually having every transistors are electrically isolated from each other. Notwithstanding, as a modification, it may be available that at least any ones of the wells individually having every transistors are electrically isolated for allowing the back bias voltage control unit to separately control the threshold voltages of the transistors formed in the above at least any ones of the wells.

As a further modification, it is also available that the conductivity types of the semiconductor regions in the delay circuit are inverted. For example, the delay circuit may be formed on an n-type semiconductor substrate, wherein a deep p-well and a p-well are formed on the n-type semiconductor substrate and an n-well is formed on the deep p-well.

Figure 19:
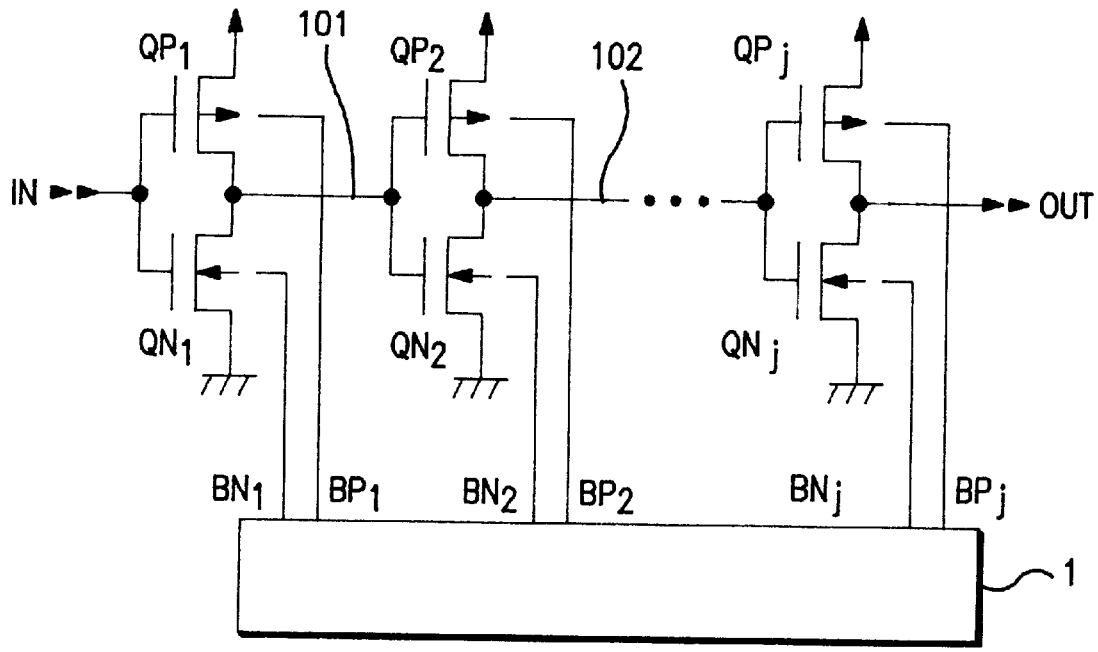
FIG. 19 is a circuit diagram illustrative of a novel delay circuit in the fifth embodiment in accordance with the present invention.

FIFTH EMBODIMENT:

A fifth embodiment according to the present invention will be described, wherein a novel delay circuit having transistors formed on a partial depletion silicon-on-insulator substrate is provided. FIG. 19 is a circuit diagram illustrative of a novel delay circuit in the fifth embodiment in accordance with the present invention. The novel delay circuit comprises series connection of a plurality of invertors. Each of the invertors comprises a complementary MOS circuit which has a pair of p-channel and n-channel MOS field effect transistors connected in series between a high voltage line and a ground line. The equivalent circuit of the novel delay circuit of the fifth embodiment is the same as in the fourth embodiment.

Namely, the first stage invertor comprises a series connection of a p-channel MOS field effect transistor QP1 and an n-channel MOS field effect transistor QN1, wherein the p-channel MOS field effect transistor QP1 is connected in series between the high voltage line and an output terminal of the first stage invertor whilst the n-channel MOS field effect transistor QN1 is connected in series between the ground line and the output terminal of the first stage invertor. Gates of the p-channel and n-channel MOS field effect transistors QP1 and QN1 are connected to the input terminal of the first stage invertor.

The second stage invertor comprises a series connection of a p-channel MOS field effect transistor QP2 and an n-channel MOS field effect transistor Qn2, wherein the p-channel MOS field effect transistor QP2 is connected in series between the high voltage line and an output terminal of the second stage invertor whilst the n-channel MOS field effect transistor QN2 is connected in series between the ground line and the output terminal of the second stage invertor. Gates of the p-channel and n-channel MOS field effect transistors QP2 and QN2 are connected to the input terminal of the second stage invertor.

The other invertors on the following stages have the same circuit configurations. The final stage invertor on the final stage comprises a series connection of a p-channel MOS field effect transistor QPj and an n-channel MOS field effect transistor QNj, wherein the p-channel MOS field effect transistor QPj is connected in series between the high voltage line and an output terminal of the final stage invertor whilst then-channel MOS field effect transistor QNj is connected in series between the ground line and the output terminal of the second stage invertor. Gates of the p-channel and n-channel MOS field effect transistors QPj and QNj are connected to the input terminal of the final stage invertor.

The above novel delay circuit has a back bias control unit 1 which is electrically connected to back bias control terminals BP1, BN1, BP2, BN2, . . . BPj and BNj. The back bias control unit 1 may have charge pump circuits which generate back bias control voltages.

Figure 20:
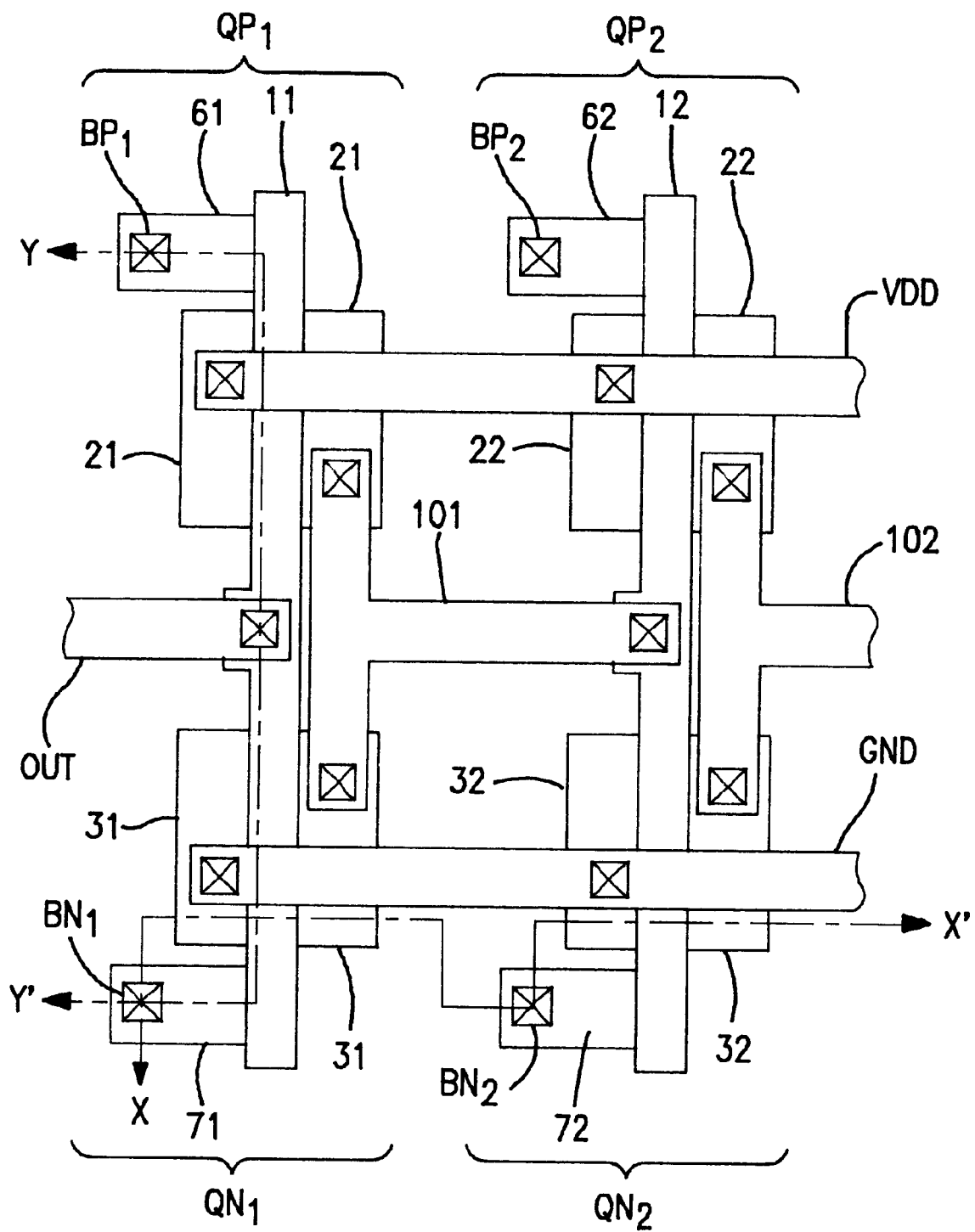
FIG. 20 is a plane view illustrative of the first and second stage invertors on the first and second stages in the delay circuit in the fifth embodiment in accordance with the present invention.
Figure 21A:
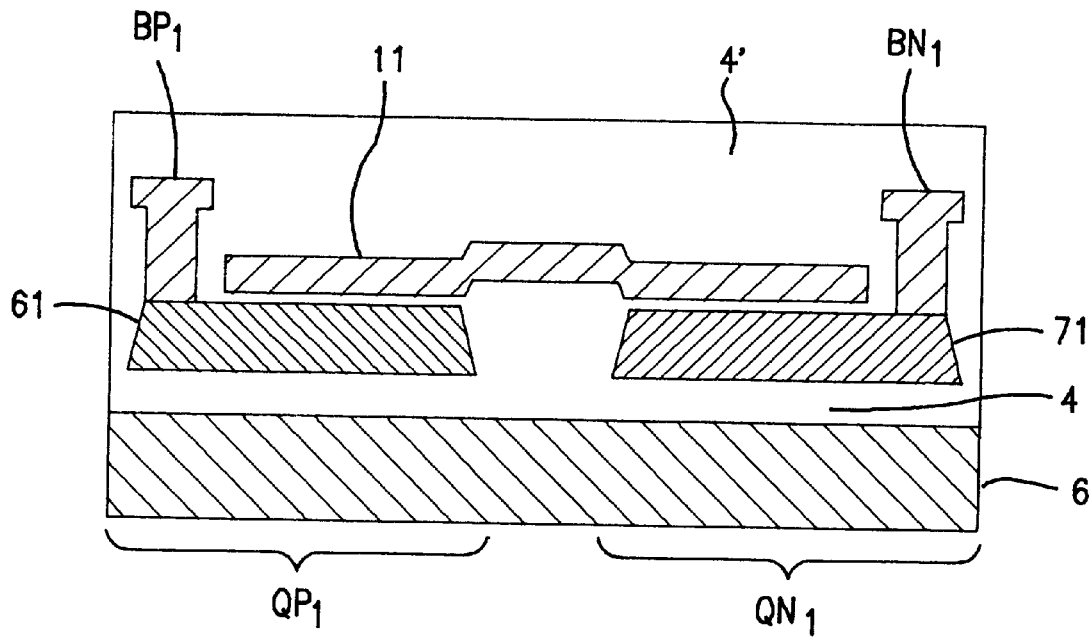
FIG. 21A is a fragmentary cross sectional elevation view taken along Y-Y' line of FIG. 20 illustrative of the first and second stage invertors on the first and second stages in the delay circuit in the fifth embodiment in accordance with the present invention.
Figure 21B:
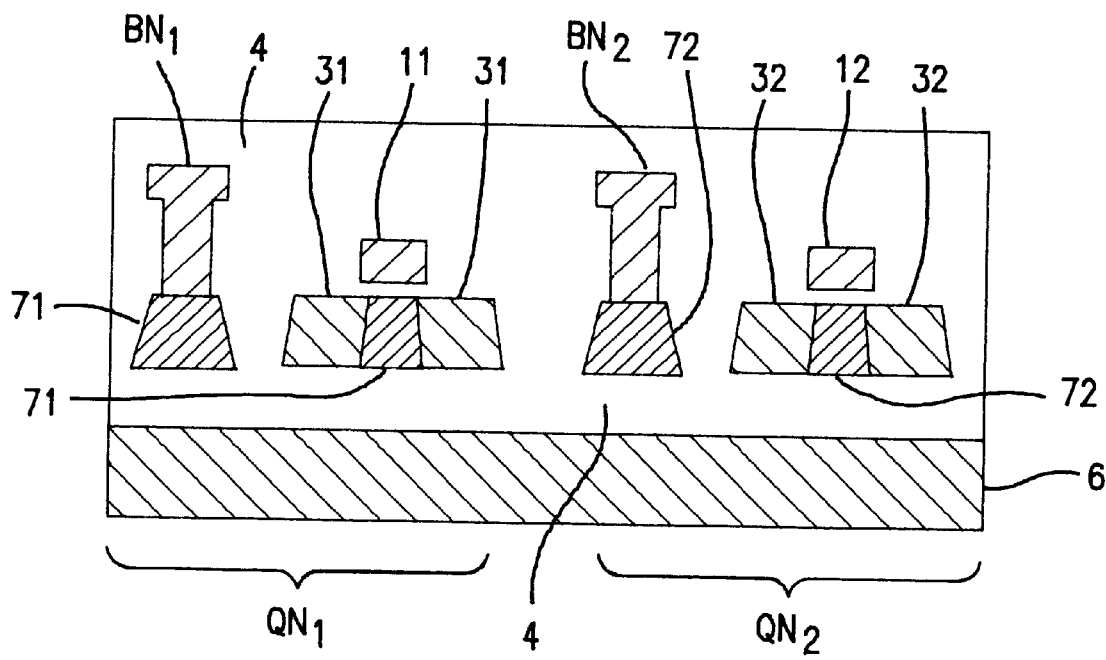
FIG. 21B is a fragmentary cross sectional elevation view taken along X-X' line of FIG. 20 illustrative of the first and second stage invertors on the first and second stages in the delay circuit in the fifth embodiment in accordance with the present invention.

FIG. 20 is a plane view illustrative of the first and second stage invertors on the first and second stages in the delay circuit in the fifth embodiment in accordance with the present invention. FIG. 21A is a fragmentary cross sectional elevation view taken along Y-Y' line of FIG. 20 illustrative of the first and second stage invertors on the first and second stages in the delay circuit in the fifth embodiment in accordance with the present invention. FIG. 21B is a fragmentary cross sectional elevation view taken along X-X' line of FIG. 20 illustrative of the first and second stage invertors on the first and second stage sin the delay circuit in the fifth embodiment in accordance with the present invention.

An insulation film 4 is formed which extends over a semiconductor substrate 6. The semiconductor substrate 6 may be either of n-type and p-type. Further, n-type silicon-on-insulator layers 61 and 62 and p-type silicon-on-insulator layers 71 and 72 are selectively formed on the insulation film 4 to form the silicon-on-insulator structure. The n-type silicon-on-insulator layer 61, and the p-type silicon-on-insulator layers 71 and 72 are isolated from each other by the insulation film 4. A pair of p-type diffusion layers 21 are provided in the opposite sides of the n-type silicon-on-insulator layer 61. A pair of p-type diffusion layers 22 are provided in the opposite sides of the n-type silicon-on-insulator layer 62. A pair of n-type diffusion layers 31 are provided in the opposite sides of the p-type silicon-on-insulator layer 71. A pair of n-type diffusion layers 32 are provided in the opposite sides of the p-type silicon-on-insulator layer 72. Further, an insulation film 4' is provided which extends over the n-type silicon-on-insulator layers 61 and 62 and the p-type silicon-on-insulator layers 71 and 72 as well as over the insulation layer 4. Gate electrodes 11 and 12 are formed in the insulation film 4' so that the gate electrode 11 extends over the n-type silicon-on-insulator layer 61 between the p-type diffusion layers 21 and over the p-type silicon-on-insulator layer 71 between the n-type diffusion layers 31 whilst the gate electrode 12 extends over the n-type silicon-on-insulator layer 62 between the p-type diffusion layers 22 and over the p-type silicon-on-insulator layer 72 between the n-type diffusion layers 32. Back bias control terminals BP1, BN1, BP2 and BN2 are also formed in the insulation film 4'. The back gate control terminal BP1 is provided in contact with the n-type silicon-on-insulator layer 61 so that the back gate control terminal BP1 is electrically connected to the n-type silicon-on-insulator layer 61. The back gate control terminal BN1 is provided in contact with the p-type silicon-on-insulator layer 71 so that the back gate control terminal BN1 is electrically connected to the p-type silicon-on-insulator layer 71. The back gate control terminal BP2 is provided in contact with the n-type silicon-on-insulator layer 62 so that the back gate control terminal PB2 is electrically connected to the n-type silicon-on-insulator layer 62. The back gate control terminal BN2 is provided in contact with the p-type silicon-on-insulator layer 72 so that the back gate control terminal BN2 is electrically connected to the p-type silicon-on-insulator layer 72.

Subsequently, operations of the above delay circuit of the fifth embodiment will be described. The operations of the above delay circuit of the fifth embodiment are basically the same as in the fourth embodiment.

The above delay circuit provides the following two remarkable effects. The first effect is concerned with a reduction in occupied area of the delay circuit because any MOS field effect transistors with any large gate width are never required. The second effect is to allow the delay circuit to vary the delay time, the rise time and the fall time. Namely, the delay time is controllable on operation of the delay circuit because the delay time is controllable by the back bias control unit.

Further, the silicon-on-insulator layers 61 62, 71 and 72 are isolated by the insulation film 4 from the semiconductor substrate 6, for which reason potentials of the silicon-on-insulator layers 61 62, 71 and 72 which partially serve as channel regions under the gate electrodes 11 and 12 are free from any influence of the potential of the semiconductor substrate 6. This means that the available range of the back bias control voltage level is widen as compared to when the transistors are formed in the wells.

As a modification, it is also available that the conductivity types of the semiconductor regions in the delay circuit are inverted.

Figure 22:
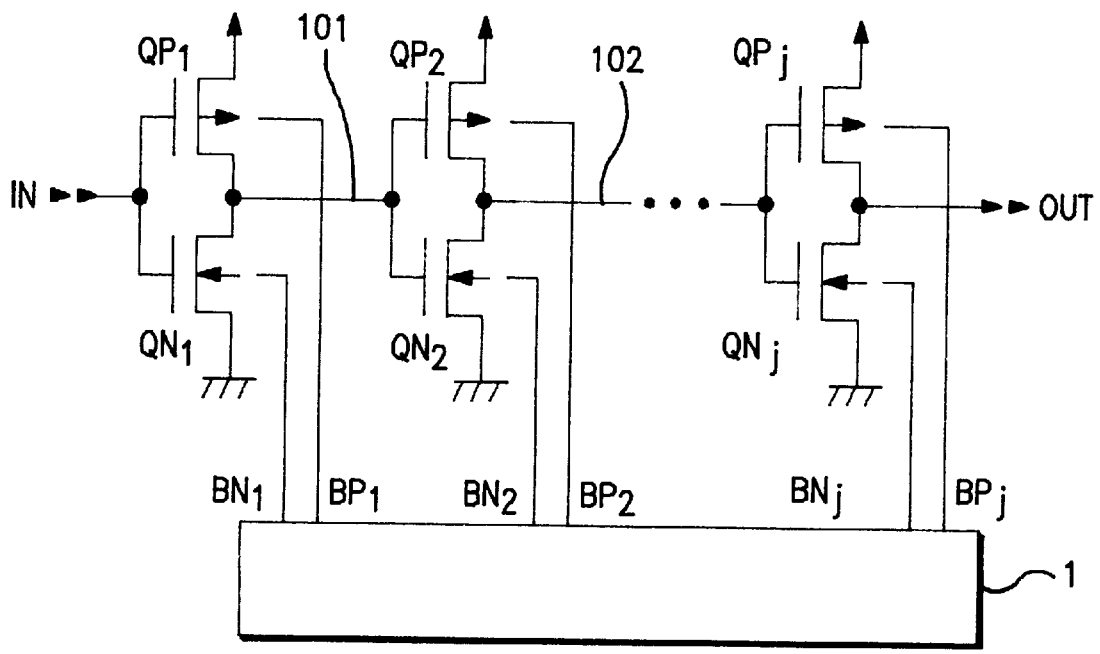
FIG. 22 is a circuit diagram illustrative of a novel delay circuit in the sixth embodiment in accordance with the present invention.

SIXTH EMBODIMENT:

A sixth embodiment according to the present invention will be described, wherein a novel delay circuit having transistors formed on a complete depletion silicon-on-insulator substrate is provided. FIG. 22 is a circuit diagram illustrative of a novel delay circuit in the sixth embodiment in accordance with the present invention. The novel delay circuit comprises series connection of a plurality of invertors. Each of the invertors comprises a complementary MOS circuit which as a pair of p-channel and n-channel MOS field effect transistors connected in series between a high voltage line and a ground line. The equivalent circuit of the novel delay circuit of the sixth embodiment is the same as in the fourth embodiment.

Namely, the first stage invertor comprises a series connection of a p-channel MOS field effect transistor QP1 and an n-channel MOS field effect transistor QN1, wherein the p-channel MOS field effect transistor QP1 is connected in series between the high voltage line and an output terminal of the first stage invertor whilst the n-channel MOS field effect transistor QN1 is connected in series between the ground line and the output terminal of the first stage invertor. Gates of the p-channel and n-channel MOS field effect transistors QP1 and QN1 are connected to the input terminal of the first stage invertor.

The second stage invertor comprises a series connection of a p-channel MOS field effect transistor QP2 and an n-channel MOS field effect transistor QN2, wherein the p-channel MOS field effect transistor QP2 is connected in series between the high voltage line and an output terminal of the second stage invertor whilst the n-channel MOS field effect transistor QN2 is connected in series between the ground line and the output terminal of the second stage invertor. Gates of the p-channel and n-channel MOS field effect transistors QP2 and QN2 are connected to the input terminal of the second stage invertor.

The other invertors on the following stages have the same circuit configurations. The final stage invertor on the final stage comprises a series connection of a p-channel MOS field effect transistor QPj and an n-channel MOS field effect transistor QNj, wherein the p-channel MOS field effect transistor QPj is connected in series between the high voltage line and an output terminal of the final stage invertor whilst the n-channel MOS field effect transistor QNj is connected in series between the ground line and the output terminal of the second stage invertor. Gates of the p-channel and n-channel MOS field effect transistors QPj and QNj are connected to the input terminal of the final stage invertor.

The above novel delay circuit has a back bias control unit 1 which is electrically connected to back bias control terminals BP1, BN1, BP2, BN2, . . . BPj and BNj. The back bias control unit 1 may have charge pump circuits which generate back bias control voltages.

Figure 23:
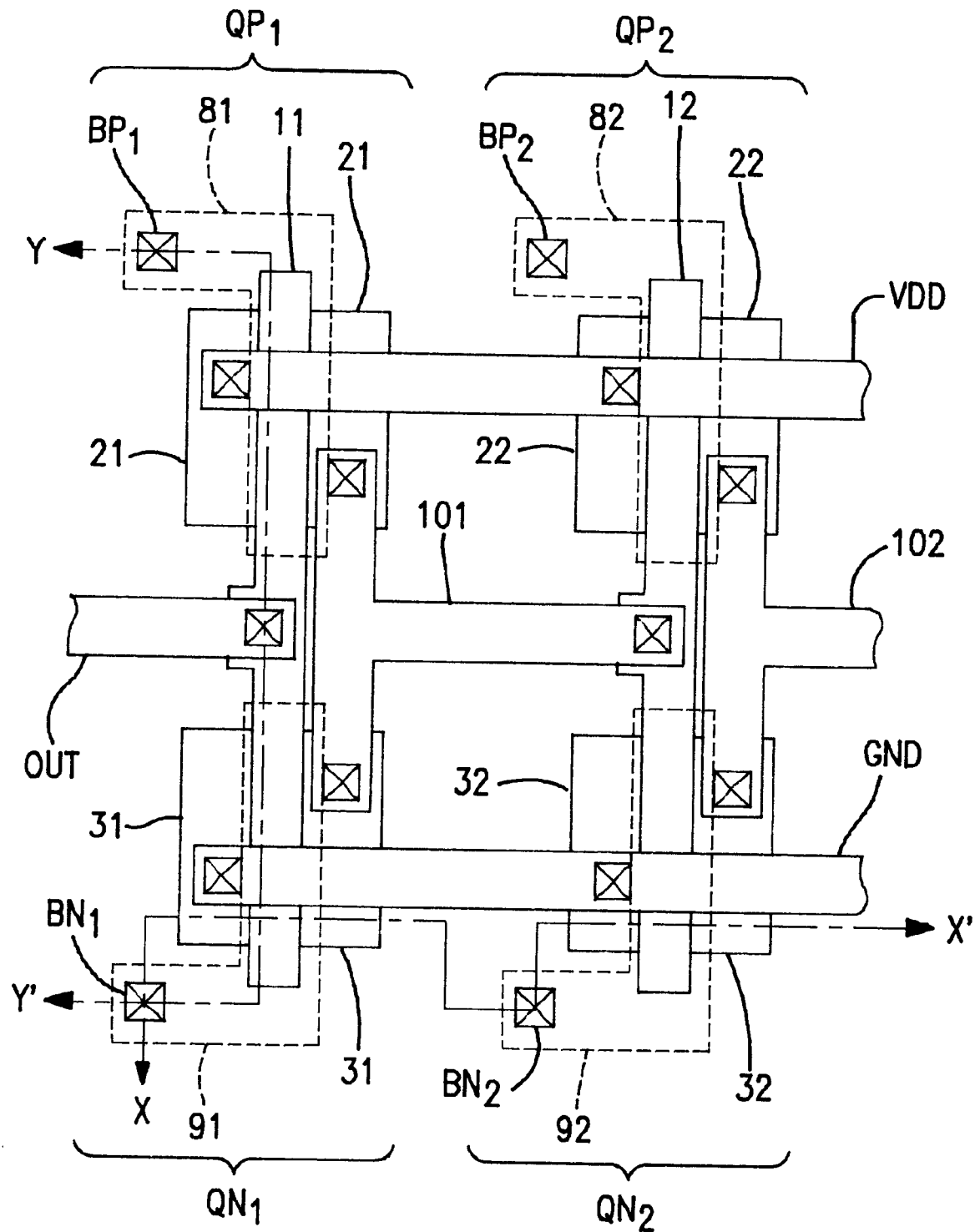
FIG. 23 is a plane view illustrative of the first and second stage invertors on the first and second stages in the delay circuit in the sixth embodiment in accordance with the present invention.
Figure 24A:
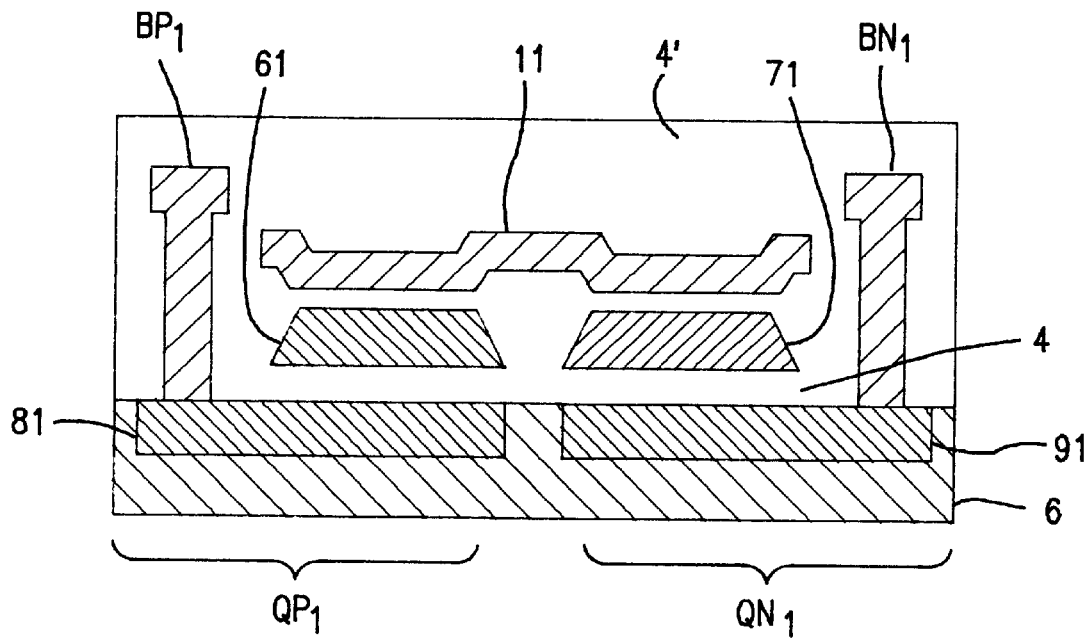
FIG. 24A is a fragmentary cross sectional elevation view taken along Y-Y' line of FIG. 23 illustrative of the first and second stage invertors on the first and second stages in the delay circuit in the sixth embodiment in accordance with the present invention.
Figure 24B:
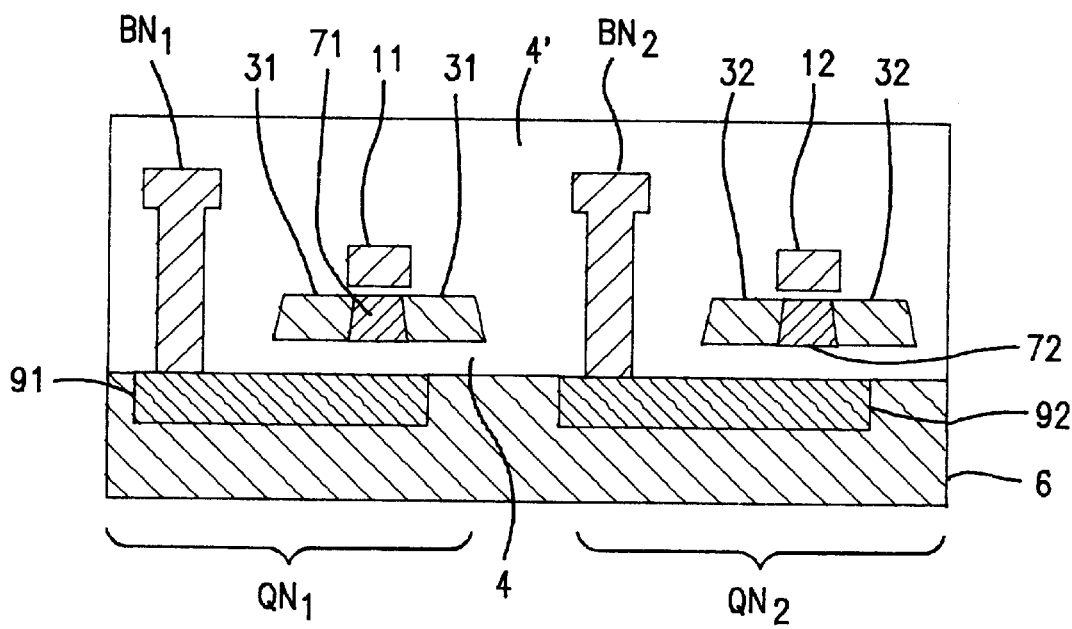
FIG. 24B is a fragmentary cross sectional elevation view taken along X-X' line of FIG. 23 illustrative of the first and second stage invertors on the first and second stages in the delay circuit in the sixth embodiment in accordance with the present invention.

FIG. 23 is a plane view illustrative of the first and second stage invertors on the first and second stages in the delay circuit in the sixth embodiment in accordance with the present invention. FIG. 24A is a fragmentary cross sectional elevation view taken along Y-Y' line of FIG. 23 illustrative of the first and second stage invertors on the first and second stages in the delay circuit in the sixth embodiment in accordance with the present invention. FIG. 24B is a fragmentary cross sectional elevation view taken along X-X' line of FIG. 23 illustrative of the first and second stage invertors on the first and second stages in the delay circuit in the sixth embodiment in accordance with the present invention.

An insulation film 4 is formed which extends over a semiconductor substrate 6. The semiconductor substrate 6 may be either of n-type and p-type. Further, n-type silicon-on-insulator layers 61 and 62 and p-type silicon-on-insulator layers 71 and 72 are selectively formed on the insulation film 4 to form the silicon-on-insulator structure. The n-type silicon-on-insulator layer 61, and the p-type silicon-on-insulator layers 71 and 72 are isolated from each other by the insulation film 4. A pair of p-type diffusion layers 21 are provided in the opposite sides of the n-type silicon-on-insulator layer 61. A pair of p-type diffusion layers 22 are provided in the opposite sides of the n-type silicon-on-insulator layer 62. A pair of n-type diffusion layers 31 are provided in the opposite sides of the p-type silicon-on-insulator layer 71. A pair of n-type diffusion layers 32 are provided in the opposite sides of the p-type silicon-on-insulator layer 72. Further, an insulation film 4' is provided which extends over the n-type silicon-on-insulator layers 61 and 62 and the p-type silicon-on-insulator layers 71 and 72 as well as over the insulation layer 4. Gate electrodes 11 and 12 are formed in the insulation film 4' so that the gate electrode 11 extends over the n-type silicon-on-insulator layer 61 between the p-type diffusion layers 21 and over the p-type silicon-on-insulator layer 71 between the n-type diffusion layers 31 whilst the gate electrode 12 extends over the n-type silicon-on-insulator layer 62 between the p-type diffusion layers 22 and over the p-type silicon-on-insulator layer 72 between the n-type diffusion layers 32. Back bias control terminals BP1, BN1, BP2 and BN2 are also formed in the insulation film 4'. Further, back gates 81, 82, 91 and 92 are formed in an upper region of the semiconductor substrate 6 so that the top surfaces of the back gates 81, 82, 91 and 92 are the same level as the top surface of the semiconductor substrate 6. Namely, the back gates 81, 82, 91 and 92 are formed beneath the insulation film 4 so that the back gates 81, 82, 91 and 92 are isolated by the insulation film 4 from the n-type silicon-on-insulator layers 61 and 62 and from the p-type silicon-on-insulator layers 71 and 72. The back gates 81, 82, 91 and 92 comprise semiconductor layers having opposite conductivity type to that of the semiconductor substrate 6. The back gate 81 is positioned under the n-type silicon-on-insulator layer 61 between the p-type diffusion layers 21. The back gate 82 is positioned under the n-type silicon-on-insulator layer 62 between the p-type diffusion layers 22. The back gate 91 is positioned under the p-type silicon-on-insulator layer 71 between the n-type diffusion layers 31. The back gate 92 is positioned under the p-type silicon-on-insulator layer 72 between the n-type diffusion layers 32. The back gate control terminal BP1 is provided in contact with the back gate 81 so that the back gate control terminal BP1 is electrically connected to the back gate 81. The back gate control terminal BN1 is provided in contact with the back gate 91 so that the back gate control terminal BN1 is electrically connected to the back gate 91. The back gate control terminal BP2 is provided in contact with the back gate 82 so that the back gate control terminal BP2 is electrically connected to the back gate 82. The back gate control terminal BN2 is provided in contact with the back gate 92 so that the back gate control terminal BN2 is electrically connected to the back gate 92.

Subsequently, operations of the above delay circuit of the second embodiment will be described. The operations of the above delay circuit of the sixth embodiment are basically the same as in the fourth embodiment.

The above delay circuit provides the following two remarkable effects. The first effect is concerned with a reduction in occupied area of the delay circuit because any MOS field effect transistors with any large gate width are never required. The second effect is to allow the delay circuit to vary the delay time, the rise time and the fall time. Namely, the delay time is controllable on operation of the delay circuit because the delay time is controllable by the back bias control unit.

Further, the silicon-on-insulator layers 61 62, 71 and 72 are isolated by the insulation film 4 from the back gates 81, 82, 91 and 92, for which reason potentials of the back gates 81, 82, 91 and 92 are free from any influence of the potentials of the silicon-on-insulator layers 61 62, 71 and 72. This means that the available range of the back bias control voltage level is widen as compared to when the transistors are formed in the wells.

As a modification, it is also available that the conductivity types of the semiconductor regions in the delay circuit are inverted.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuitry comprising:
 a series connection of a plurality of invertor gates, each of which has field effect transistors, wherein at least one of said field effect transistors has a back bias control terminal; and
 a various bias voltage generator being capable of generating at least one bias voltage and also capable of varying said at least one bias voltage individually, said various bias voltage generator being also electrically connected to said back bias control terminal of said at least one of said field effect transistors for applying said at least one bias voltage to said back bias control terminal so that said various bias voltage generator is operated to individually vary said at least one bias voltage thereby to individually vary a threshold voltage of said at least one of said field effect transistors.

2. The circuitry as claimed in claim 1, wherein a plurality of said field effect transistors have said back bias control terminals and said various bias voltage generator is capable of vary a plurality of said bias voltage individually so as to individually vary threshold voltages of said plurality of said field effect transistors having said back bias control terminals.

3. The circuitry as claimed in claim 2, wherein all of said field effect transistors have said back bias control terminals and said various bias voltages generator is capable of vary a plurality of said bias voltage independently so as to separately vary threshold voltages of said all field effect transistors.

4. The circuitry as claimed in claim 1, wherein said field effect transistors are formed in at least a plurality of first conductivity type semiconductor well regions electrically isolated from each other and also formed in at least a second conductivity type semiconductor well region electrically isolated from said first conductivity type semiconductor well regions, and wherein at least one of said first conductivity type semiconductor well regions has said back bias control terminal electrically connected to said various bias voltage generator so that said various bias voltage generator is operated to separately vary a potential of said at least one of said first conductivity type semiconductor well regions thereby to separately vary a threshold voltage of said at least one of said field effect transistors.

5. The circuitry as claimed in claim 4, wherein said field effect transistors are formed in a plurality of first conductivity type semiconductor well regions electrically isolated from each other and also formed in a plurality of second conductivity type semiconductor well regions electrically isolated from each other and from said first conductivity type semiconductor well regions, and wherein all of said first and second conductivity type semiconductor well regions have said back bias control terminals electrically connected to said various bias voltage generator so that said various bias voltage generator is operated to individually vary potentials of all of said first and second conductivity type semiconductor well regions thereby to individually vary threshold voltages of all of said field effect transistors.

6. The circuitry as claimed in claim 1, wherein said field effect transistors have a silicon-on-insulator structure and at least one of said field effect transistors has a channel region electrically connected to said back bias control terminal electrically connected to said various bas voltage generator so that said various bias voltage generator is operated to individually vary a potential of said channel region of said at least one of said field effect transistors thereby to individually vary a threshold voltage of said at least one of said field effect transistors.

7. The circuitry as claimed in claim 6, wherein all of said field effect transistors have channel regions electrically connected to said back bias control terminals electrically connected to said various bias voltage generator so that said various bias voltage generator is operated to separately vary potentials of said channel regions of all of said field effect transistors thereby to separately vary threshold voltages of all of said field effect transistors.

8. The circuitry as claimed in claim 1, wherein said field effect transistors have a silicon-on-insulator structure and at least one of said field effect transistors has a back gate electrode in a surface region of a semiconductor substrate and said back gate electrode is electrically connected to said back bias control terminal electrically connected to said various bias voltage generator so that said various bias voltage generator is operated to individually vary a potential of said back gate electrode of said at least one of said field effect transistors thereby to individually vary a threshold voltage of said at least one of said field effect transistors.

9. The circuitry as claimed in claim 8, wherein all of said field effect transistors have back gate electrodes electrically connected to said back bias control terminals electrically connected to said various bias voltage generator so that said various bias voltage generator is operated to separately vary potentials of said back gate electrodes of all of said field effect transistors thereby to separately vary threshold voltages of all of said field effect transistors.

10. The circuitry as claimed in claim 1, wherein said invertor gates of add stages are connected in series to each other to form a ring-oscillator circuit.

11. The circuitry as claimed in claim 1, wherein said invertor gates of even stages are connected in series to each other to form a delay circuit.

12. The circuitry as claimed in claim 1, wherein each of said invertor gates comprises a complementary MOS circuit which comprises a series connection of p-channel and n-channel MOS field effect transistors between a high voltage line and a ground line.

13. A semiconductor device comprising:

a semiconductor substrate;

a series connection of a plurality of invertor gates integrated on said semiconductor substrate, each of said invertor gates having field effect transistors, wherein at least one of said field effect transistors has a back bias control terminal; and a various bias voltage generator being capable of generating at least one bias voltage and also capable of varying said at least one bias voltage individually, said various bias voltage generator being also electrically connected to said back bias control terminal of said at least one of said field effect transistors for applying said at least one bias voltage to said back bias control terminal so that said various bias voltage generator is operated to individually vary said at least one bias voltage thereby to individually vary a threshold voltage of said at lest one of said field effect transistors.

14. The semiconductor device as claimed in claim 13, wherein a plurality of said field effect transistors have said back bias control terminals and said various bias voltage generator is capable of vary a plurality of said bias voltage individually so as to individually vary threshold voltages of said plurality of said field effect transistors having said back bias control terminals.

15. The semiconductor device as claimed in claim 14, wherein all of said field effect transistors have said back bias control terminals and said various bias voltage generator is capable of vary a plurality of said bias voltage independently so as to separately vary threshold voltages of said all field effect transistors.

16. The semiconductor device as claimed in claim 13, wherein said field effect transistors are formed in at least a plurality of first conductivity type semiconductor well regions electrically isolated from each other and also formed in at least a second conductivity type semiconductor well region electrically isolated from said first conductivity type semiconductor well well regions, and wherein at least one of said first conductivity type semiconductor well regions has said back bias control terminal electrically connected to said various bias voltage generator so that said various bias voltage generator is operated to separately vary a potential of said at least one of said first conductivity type semiconductor well regions thereby to separately vary a threshold voltage of said at least one of said field effect transistors.

17. The semiconductor device as claimed in claim 16, wherein said field effect transistors are formed in a plurality of first conductivity type semiconductor well regions electrically isolated from each other and also formed in a plurality of second conductivity type semiconductor well regions electrically isolated from each other and from said first conductivity type semiconductor well regions, and wherein all of said first and second conductivity type semiconductor well regions have said back bias control terminals electrically connected to said various bias voltage generator so that said various bias voltage generator is operated to individually vary potentials of all of said first and second conductivity type semiconductor well regions thereby to individually vary threshold voltages of all of said field effect transistors.

18. The semiconductor device as claimed in claim 13, wherein said field effect transistors have a silicon-on-insulator structure and at least one of said field effect transistors has a channel region electrically connected to said back bias control terminal electrically connected to said various bias voltage generator so that said various bias voltage generator is operated to individually vary a potential of said channel region of said at least one of said field effect transistors thereby to individually vary a threshold voltage of said at least one of said field effect transistors.

19. The semiconductor device as claimed in claim 18, wherein all of said field effect transistors have channel regions electrically connected to said back bias control terminals electrically connected to said various bias voltage generator so that said various bias voltage generator is operated to separately vary potentials of said channel regions of all of said field effect transistors thereby to separately vary threshold voltages of all of said field effect transistors.

20. The semiconductor device as claimed in claim 13, wherein said field effect transistors have a silicon-on-insulator structure and at least one of said field effect transistors has a back gate electrode in a surface region of a semiconductor substrate and said back gate electrode is electrically connected to said back bias control terminal electrically connected to said various bias voltage generator so that said various bias voltage generator is operated to individually vary a potential of said back gate electrode of said at least one of said field effect transistors thereby to individually vary a threshold voltage of said at least one of said field effect transistors.

21. The semiconductor device as claimed in claim 20, wherein all of said field effect transistors have back gate electrodes electrically connected to said back bias control terminals electrically connected to said various bias voltage generator so that said various bias voltage generator is operated to separately vary potentials of said back gate electrodes of all of said field effect transistors thereby to separately vary threshold voltages of all of said field effect transistors.

22. The semiconductor device as claimed in claim 13, wherein said invertor gates of odd stages are connected in series to each other to form a ring-oscillator circuit.

23. The semiconductor device as claimed in claim 13, wherein said invertor gates of even stages are connected in series to each other to form a delay circuit.

24. The semiconductor device as claimed in claim 13, wherein each of said invertor gates comprises a complementary MOS circuit which comprises a series connection of p-channel an n-channel MOS field effect transistors between a high voltage line and a ground line.

25. An oscillator circuit comprising:
a series connection of a plurality of inventor gates of odd stages to form a ring-oscillator, each of said invertor gates having field effect transistors, wherein at least one of said field effect transistors has a back bias control terminal; and
a various bias voltage generator being capable of generating at least one bias voltage and also capable of varying said at least one bias voltage individually, said various bias voltage generator being also electrically connected to said back bias control terminal of said at least one of said field effect transistors for applying said at least one bias voltage to said back bias control terminal so that said various bias voltage generator is operated to individually vary said at least one bias voltage thereby to individually vary a threshold voltage of said at lest one of said field effect transistors.

26. The oscillator circuit as claimed in claim 25, wherein a plurality of said field effect transistors have said back bias control terminals and said various bias voltage generator is capable of vary a plurality of said bias voltage individually so as to individually vary threshold voltages of said plurality of said field effect transistors having said back bias control terminals.

27. The oscillator circuit as claimed in claim 26, wherein all of said field effect transistors have said back bias control terminals and said various bias voltage generator is capable of vary a plurality of said bias voltage independently so as to separately threshold voltages of said all field effect transistors.

28. The oscillator circuit as claimed in claim 25, wherein said field effect transistors are formed in at least a plurality of first conductivity type semiconductor well regions electrically isolated from each other and also formed in at least a second conductivity type semiconductor well region electrically isolated from said first conductivity type semiconductor well regions, and wherein at least one of said first conductivity type semiconductor well regions has said back bias control terminal electrically connected to said various bias voltage generator so that said various bias voltage generator is operated to separately vary a potential of said at least one of said first conductivity type semiconductor well regions thereby to separately vary a threshold voltage of said at least one of said field effect transistors.

29. The oscillator circuit as claimed in claim 28, wherein said field effect transistors are formed in a plurality of first conductivity type semiconductor well regions electrically isolated from each other and also formed in a plurality of second conductivity type semiconductor well regions electrically isolated from each other and from said first conductivity type semiconductor well regions, and wherein all of said first and second conductivity type semiconductor well regions have said back bias control terminals electrically connected to said various bias voltage generator so that said various bias voltage generator is operated to individually vary potentials of all of said first and second conductivity type semiconductor well regions thereby to individually vary threshold voltages of all of said field effect transistors.

30. The oscillator circuit as claimed in claim 25, wherein said field effect transistors have a silicon-on-insulator structure and at least one of said field effect transistors has a channel region electrically connected to said back bias control terminal electrically connected to said various bias voltage generator so that said various bias voltage generator is operated to individually vary a potential of said channel region of said at least one of said field effect transistors thereby to individually vary a threshold voltage of said at least one of said field effect transistors.

31. The oscillator circuit as claimed in claim 30, wherein all of said field effect transistors have channel regions electrically connected to said back bias control terminals electrically connected to said various bias voltage generator so that said various bias voltage generator is operated to separately vary potentials of said channel regions of all of said field effect transistors thereby to separately vary threshold voltages of all of said field effect transistors.

32. The oscillator circuit as claimed in claim 25, wherein said field effect transistors have a silicon-on-insulator structure and at least one of said field effect transistors has a back gate electrode in a surface region of a semiconductor substrate and said back gate electrode is electrically connected to said back bias control terminal electrically connected to said various bias voltage generator so that said various bias voltage generator is operated to individually vary a potential of said back gate electrode of said at least one of said field effect transistors thereby to individually vary a threshold voltage of said at least one of said field effect transistors.

33. The oscillator circuit as claimed in claim 32, wherein all of said field effect transistors have back gate electrodes electrically connected to said back bias control terminals electrically connected to said various bias voltage generator so that said various bias voltage generator is operated to separately vary potentials of said back gate electrodes of all of said field effect transistors thereby to separately vary threshold voltages of all of said field effect transistors.

34. The oscillator circuit as claimed in claim 25, wherein each of said invertor gates comprises a complementary MOS circuit which comprises a series connection of p-channel and n-channel MOS field effect transistors between a high voltage line and a ground line.

35. A delay circuit comprising:
a series connection of a plurality of invertor gates of even stages, each of said invertor gates having field effect transistors, wherein at least one of said field effect transistors has a back bias control terminal; and
a various bias voltage generator being capable of generating at least one bias voltage and also capable of varying said at least one bias voltage individually, said various bias voltage generator being also electrically connected to said back bias control terminal of said at least one of said field effect transistors for applying said at last one bias voltage to said back bias control terminal so that said various bias voltage generator is operated to individually vary said at least one bias voltage thereby to individually vary a threshold voltage of said at least one of said field effect transistors.

36. The delay circuit as claimed in claim 35, wherein a plurality of said field effect transistors have said back bias control terminals and said various bias voltage generator is capable of vary a plurality of said bias voltage individually so as to individually vary threshold voltages of said plurality of said field effect transistors having said back bias control terminals.

37. The delay circuit as claimed in claim 36, wherein all of said field effect transistors have said back bias control terminals and said various bias voltage generator is capable of vary a plurality of said bias voltage independently so as to separately vary threshold voltages of said all field effect transistors.

38. The delay circuit as claimed in claim 35, wherein said field effect transistors are formed in at least a plurality of first conductivity type semiconductor well regions electrically isolated from each other and also formed in at least a second conductivity type semiconductor well region electrically isolated from said first conductivity type semiconductor well regions, and wherein at least one of said first conductivity type semiconductor well regions has said back bias control terminal electrically connected to said various bias voltage generator so that said various bias voltage generator is operated to separately vary a potential of said at least one of said first conductivity type semiconductor well regions thereby to separately vary a threshold voltage of said at least one of said field effect transistors.

39. The delay circuit as claimed in claim 38, wherein said field effect transistors are formed in a plurality of first conductivity type semiconductor well regions electrically isolated from each other and also formed in a plurality of second conductivity type semiconductor well regions electrically isolated from each other and from said first conductivity type semiconductor well regions, and wherein all of said first and second conductivity type semiconductor well regions have said back bias control terminals electrically connected to said various bias voltage generator so that said various bias voltage generator is operated to individually vary potentials of all of said first and second conductivity type semiconductor well regions thereby to individually vary threshold voltages of all of said field effect transistors.

40. The delay circuit as claimed in claim 35, wherein said field effect transistors have a silicon-on-insulator structure and at least one of said field effect transistors has a channel region electrically connected to said back bias control terminal electrically connected to said various bias voltage generator so that said various bias voltage generator is operated to individually vary a potential of said channel region of said at least one of said field effect transistors thereby to individually vary a threshold voltage of said at least one of said field effect transistors.

41. The delay circuit as claimed in claim 40, wherein all of said field effect transistors have channel regions electrically connected to said back bias control terminals electrically connected to said various bias voltage generator so that said various bias voltage generator is operated to separately vary potentials of said channel regions of all of said field effect transistors thereby to separately vary threshold voltages of all of said field effect transistors.

42. The delay circuit as claimed in claim 35, wherein said field effect transistors have a silicon-on-insulator structure and at least one of said field effect transistors has a back gate electrode in a surface region of a semiconductor substrate and said back gate electrode is electrically connected to said back bias control terminal electrically connected to said various bias voltage generator so that said various bias voltage generator is operated to individually vary a potential of said back gate electrode of said at least one of said field effect transistors thereby to individually vary a threshold voltage of said at least one of said field effect transistors.

43. The delay circuit as claimed in claim 42, wherein all of said field effect transistors have back gate electrodes electrically connected to said back bias control terminals electrically connected to said various bias voltage generator so that said various bias voltage generator is operated to separately vary potentials of said back gate electrodes of all of said field effect transistors thereby to separately vary threshold voltages of all of said field effect transistors.

44. The delay circuit as claimed in claim 35, wherein each of said invertor gates comprises a complementary MOS circuit which comprises a series connection of p-channel and n-channel MOS field effect transistors between a high voltage line and a ground line.

* * * * *

UNITED STATES PATENT AND TRADEMARK OFFICE
CERTIFICATE OF CORRECTION

PATENT NO. : 5,912,591
DATED : June 15, 1999
INVENTOR(S) : Takashi YAMADA

It is certified that error appears in the above-indentified patent and that said Letters Patent is hereby corrected as shown below:

Col. 13, line 34, change "an ON-current" to --a saturation current--;

line 38, change "ON-current" to --saturation current--;

line 41, equation (2), change "Ion=(ß/2)x(VGS-Vth)" to --Ion=(ß/2)x(VGS-Vth)$^{\alpha}$--.

Signed and Sealed this

Seventeenth Day of April, 2001

Attest:

NICHOLAS P. GODICI

*Attesting Officer*   Acting Director of the United States Patent and Trademark Office